United States Patent
Saito et al.

(10) Patent No.: US 6,822,547 B2
(45) Date of Patent: Nov. 23, 2004

(54) CURRENT TRANSFORMER

(75) Inventors: Minoru Saito, Kanagawa-ken (JP); Hiroyuki Maehara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/282,226

(22) Filed: Oct. 29, 2002

(65) Prior Publication Data
US 2003/0090356 A1 May 15, 2003

(30) Foreign Application Priority Data
Oct. 29, 2001 (JP) ........................................ 2001-330688

(51) Int. Cl.[7] ................................................ H01F 5/00
(52) U.S. Cl. ........................ 336/200; 336/223; 336/232
(58) Field of Search ................................. 336/200, 223, 336/232; 324/117, 127

(56) References Cited

U.S. PATENT DOCUMENTS

| 5,414,400 A | 5/1995 | Gris et al. |
| 6,313,623 B1 * | 11/2001 | Kojovic et al. ............. 324/127 |
| 6,624,624 B1 * | 9/2003 | Karrer et al. ........... 324/117 R |
| 2003/0137388 A1 | 7/2003 | Meier et al. |

FOREIGN PATENT DOCUMENTS

| DE | 296 11 276 U1 | 7/1997 |
| DE | 198 54 436 A1 | 6/2000 |
| DE | 201 01 454 U1 | 5/2001 |
| EP | 0 750 382 A2 | 12/1996 |
| GB | 2 342 783 A | 4/2000 |
| JP | 6-176947 A | 6/1994 |
| JP | 2000-228323 A | 8/2000 |

* cited by examiner

Primary Examiner—Anh Mai
(74) Attorney, Agent, or Firm—Foley & Lardner LLP

(57) ABSTRACT

A current transformer, includes, a Rogowski coil for detecting an alternating current of a main circuit, and outputting a measure of the alternating current as an analog-voltage signal, includes, a printed circuit board, a sensor unit and an optic transmission path. The printed circuit board with four conducting layers, having an opening at a center portion which a conductor penetrates, comprises metal foils, each extended in the shape of radiating from a center that is approximately the center of the opening, mounted on both sides of surface of the printed circuit board and on two inner conducting layers of the printed circuit board, a first winding formed by electrically connecting metal foils on a first outer side of surface of the printed circuit board and metal foils on a first inner conducting layer of the printed circuit board adjacent to the first outer side of the surfaces of the printed circuit board with first plated through holes penetrating the printed circuit board in a thickness direction, a second winding formed by electrically connecting metal foils on a second outer side of surface of the printed circuit board and metal foils on a second inner conducting layer of the printed circuit board adjacent to the second outer side of the surface of the printed circuit board with second plated through holes penetrating the printed circuit board in a thickness direction, the first winding and the second winding connected as mirror images of each other, and connected in series. The sensor unit comprises an analog-to-digital converter converting the analog-voltage signal into a digital electric signal, and an electric-to-optic converter converting the digital electric signal into a digital optical signal.

23 Claims, 14 Drawing Sheets

CURRENT TRANSFORMER

CROSS-REFERENCE TO RELATED APPLICATIONS

This application is based upon and claims the benefit of priority from the prior Japanese Patent Application No. 2001-330688 filed on Oct. 29, 2001, the entire contents of which are incorporated herein by reference.

BACKGROUND OF THE INVENTION

1. Field of the Invention

This invention relates to a current transformer which is used to measure alternating current passing in, for example, a circuit of an electric power system, and especially related to its use in a Rogowski coil.

2. Description of the Related Art

Generally, a penetrated type current transformer is used in many cases for measuring alternating current passing in electric power distribution equipment and substation main circuits equipment and so on. In a conventional penetrated type current transformer, a secondary winding is wound around a toroidal former, that is a core, and a conductor in which a primary current passes penetrates a centered opening of the core. An iron core, or non-ferromagnetic material is used as the core of this penetrated type current transformer. Among these, a current transformer using a non-ferromagnetic material is called a air core coil type current transformer or a Rogowski coil, which can acquire excellent linearity characteristics without saturation.

FIG. 11 shows the structure of a common Rogowski coil. The Rogowski coil 1 shown in this figure is constituted by a conductor winding 2 coiled from point P to point Q on all over the periphery of the core 6 made of the non-ferromagnetic material, and returning a wire (return circuit line) 3 from point Q to point R in a direction opposite to a winding direction of the winding 2 along the core 6. The return circuit line 3 usually returns between the core 6 and the winding 2. Moreover, a conductor 5 of a main circuit of an electric distribution equipment or substation equipment penetrates an opening 6a of the core 6.

In this situation, voltage is generated proportional to amount of time change of the primary current flowing in the conductor 5 between terminals 4, 4 of the winding 2 and the return circuit line 3. Accordingly, the above-mentioned primary current can be measured by integrating this voltage and multiplying a constant determined by a form of the coil. For an ideal Rogowski coil, the voltage between terminals 4, 4 is not influenced by a gap of centered points of the core 6 and the conductor 5, and by magnetic field of outside the Rogowski coil 1. An ideal Rogowski coil satisfies the following conditions: (a) a winding interval (pitch) of the winding 2 is constant, (b) an area surrounded by the winding 2 is equal to an area surrounded by the return circuit line 3, (c) cross-sectional area of the core 6 is fixed over the entire circumference and not influenced by temperature, and (d) the winding 2 is completely wound over the entire circumference of the core 6 without any missing portion.

However, when manufacturing the Rogowski coil 1 as shown in FIG. 11, it is technically difficult to satisfy the above-mentioned condition (a), that is, to wind the winding 2 to the core 6 while keeping a constant winding interval. Although a fixed winding interval can be maintained by preparing slots or projections to the core 6 for fixing position of the winding 2, a special core and winding machine is necessary for this preparation, and thus increases the price of the Rogowski coil which becomes very expensive.

A Japanese Patent Disclosure (koukai) No. 6-176947, which is a counterpart of the U.S. Pat. No. 5,414,400, discloses a means for solving this problem. FIG. 12 shows a conventional structure of the Rogowski coil indicated by this patent disclosure. In the Rogowski coil 1 shown in this figure, a metal foil 2e is formed on both sides of a printed circuit board 7 having an opening 9 penetrated by a conductor 5 at a central part so as to provide straight lines radially spreading from the center of the opening 9. Moreover, the winding 2 and the return circuit line 3 is constituted so that the radially-arranged metal foils 2c of one side surface of the printed circuit board 7 and the metal foils of a reverse side surface thereof are electrically connected by plated holes which penetrate the printed circuit board 7. In the example shown in FIG. 12, the return circuit line 3 is formed in the shape of winding, thus, the output voltage between the terminals 4, 4 per unit current and unit frequency becomes large, and sensitivity of the Rogowski coil 1 improves. In addition, winding progress direction of the winding 2 is in a clockwise rotation, and that of the return circuit line 3 is in a counterclockwise rotation.

According to such conventional technology, by applying general technique of manufacturing printed circuit boards, the Rogowski coil 1 can be cheaply manufactured while keeping winding intervals of the winding 2 and the return circuit line 3 constant. Therefore, it becomes possible to realize the condition (a) mentioned above to a great degree.

By the way, also in the conventional Rogowski coil mentioned above, the condition (b) mentioned above, that is, the condition of making an area which the winding 2 surrounds and an area which the return circuit line 3 surrounds equal, cannot be fulfilled completely. This makes it easy for the Rogowski coil to be influenced by an external magnetic field, and this gives rise an error at the time of current measurement increases.

FIG. 13 is a pattern diagram showing a situation that magnetic flux Φ due to an external magnetic field interlinks the winding 2 of the common Rogowski coil 1 as shown in FIG. 11. FIG. 14 is a pattern diagram showing a situation that the same magnetic flux Φ due to an external magnetic field interlinks the return circuit line 3 of the common Rogowski coil 1 as shown in FIG. 11.

Since the winding progress direction of the winding 2 is reverse of that of the return circuit line 3, the voltage generated between the terminals 4, 4 of the Rogowski coil 1 shown in FIG. 11 is equal to difference of the voltage generated between the points P and Q shown in FIG. 13 and the voltage energized between the points P and Q shown in FIG. 14. Assuming that the magnetic flux Φ due to the external magnetic field is uniform over the whole surface of the Rogowski coil 1, if the area A, designated by diagonal hatched lines in FIG. 13, which the winding surrounds is not equal to the area B, designated by diagonal hatched lines in FIG. 14, which the return circuit line surrounds, a voltage due to the exterior magnetic field is generated between the terminals 4, 4. Since this voltage is unrelated to the primary current which should originally be measured, it causes a measurement error.

Factors that give rise an external magnetic field are explained below. For example, the external magnetic field is generated when a bend exists in the conductor 5 or when a current flowing conductor 8 exists near the Rogowski coil 1 as shown in FIG. 15, or when the conductor 5 is arranged at an angle to the Rogowski coil 1. When applying the Rogowski coil 1 to an actual electric power distribution main circuit equipment or substation main circuit equipment, it is impossible to completely eliminate the above-mentioned factors. In addition, usually, since an actual magnetic flux Φ due to the external magnetic field is not uniform, the influence becomes still more complicated.

It is possible to reduce an error by completely making the area A which the winding surrounds and the area B which the return circuit line 3 surrounds equal, more preferably, by arranging the form of the winding 2 and the form of the return circuit line 3 to be completely identical. However, in the common Rogowski coil 1 shown in FIG. 11, it is difficult to manufacture while controlling the area the return circuit line 3 surrounds being constant, thus it is very difficult to avoid the influence of an external magnetic field. On the other hand, though the Rogowski coil shown in FIG. 12 reduces the influence of an external magnetic field considerably, there is still the influence of the external magnetic field because of the reason that the area the return circuit line 3 is smaller than the area the winding 2 surrounds.

Now, although the influence of the external magnetic field to the Rogowski coil has been explained so far, another problem is explained here. That is, although it has been stated that the influence of the external magnetic field can be considerably reduced by adopting the Rogowski coil as shown in FIG. 12, there is still a problem that the common Rogowski coil shown in FIG. 11 cannot be replaced with the Rogowski coil shown in FIG. 12 easily. The reason why it cannot be replaced easily is that, in the Rogowski coil shown in FIG. 12, a scale of the secondary output voltage of the Rogowski coil in terms of the primary current (the scale corresponds to a current transformation ratio in case of an iron core type current transformer) cannot be raised to a level of that of the common Rogowski coil shown in FIG. 11.

As known well, the secondary output voltage of a Rogowski coil is proportional to the product of a number of turns of the coil and a cross-sectional area of one turn coil. As for the common Rogowski coil shown in FIG. 11, the secondary output voltage in terms of the primary rated current is usually several tens of volts per kilo ampere. In the Rogowski coil shown in FIG. 11, since cross section of one turn coil can be decided arbitrarily as long as restrictions of an attachment space allow, and since the number of turns of the coil can be adjusted so that required secondary output voltage may be obtained, by means such as double winding or triple winding, several tens of volts per kilo ampere can be obtained easily as the secondary output voltage. If the several tens of volts per kilo ampere can be obtained as the secondary output voltage from the Rogowski coil, an analog voltage signal can be transmitted without being influenced by noises from the power distribution main circuit equipment or substation main circuit equipment in the field where the Rogowski coil is installed to the main control building of electric power installation where a protection units and control units are affected, that is, without degradation of a signal which effects the protection units and the control units.

However, for the Rogowski coil shown in FIG. 12, there is a physical limit in a number of turns of a coil and a size of cross section of one turn coil in the winding, because of the structural reason that the winding 2 is composed of the metal foils 2e formed on the printed circuit board 7. Although depended on the size of the printed circuit board and the width of the metal foil, a number of turns of a coil is limited to at most one thousand, and the cross section of one turn coil in the winding is restricted due to the fact that the manufacturing limit of thickness of the printed circuit board is at most 5 to 6 millimeters. Thus, the secondary output voltage of the Rogowski coil shown in FIG. 12 is limited at most 100 mV/kA. Though it is assumed that ten sheets of the Rogowski coils are connected in series, the secondary output voltage is about 1 V/kA, and, from a viewpoint on withstanding transmission noise, it is difficult to transmit an accurate analog-voltage signal to a main control building of an electric power installation.

SUMMARY OF THE INVENTION

Accordingly, it is an object of embodiments of this invention to solve problems of the above-mentioned conventional technology, and to provide a current transformer using a Rogowski coil that prevents the influence of an exterior magnetic field to current measurement, even if an exterior magnetic field exists and penetrates an opening at a center portion of a core, and thus, enables to current measurement with high accuracy.

Other and further objects of this invention will become apparent upon an understanding of the illustrative embodiments to be described herein or will be indicated in the appended claims while various advantages not referred to herein will be appeared to one skilled in the art upon employment of the invention in practice.

According to one aspect of the invention, there is provided a current transformer, comprising, (a) a Rogowski coil which detects an alternating current of a main circuit of power distribution equipment or substation main circuits equipment, and outputs a measure of the alternating current as an analog-voltage signal, the Rogowski coil comprising, a printed circuit board of multilayer type comprising four conducting layers of interconnections, having an opening at a center portion which a conductor penetrates, a plurality of metal foils, each extended in the shape of radiating from a center that is approximately the center of the opening, mounted on both sides of surface of the printed circuit board and on two inner conducting layers of the printed circuit board, a first winding formed by electrically connecting metal foils on a first outer side of surface of the printed circuit board and metal foils on a first inner conducting layer of the printed circuit board adjacent to the first outer side of the surfaces of the printed circuit board with first plated through holes penetrating the printed circuit board in a thickness direction, a second winding formed by electrically connecting metal foils on a second outer side of surface of the printed circuit board and metal foils on a second inner conducting layer of the printed circuit board adjacent to the second outer side of the surface of the printed circuit board with second plated through holes penetrating the printed circuit board in a thickness direction, and the first winding and the second winding connected as mirror images of each other, and connected in series, (b) a sensor unit, comprising, an analog-to-digital converter which converts the analog-voltage signal into a digital electric signal, and an electric-to-optic converter which converts the digital electric signal into a digital optical signal, and (c) an optic transmission means which transmits the digital optical signal to upstream system.

According to another aspect of the invention, there is provided a current transformer, comprising, (a) a Rogowski coil which detects an alternating current of a main circuit of power distribution equipment or substation main circuits equipment, and outputs a measure of the alternating current as an analog-voltage signal, the Rogowski coil comprising, a printed circuit board assembly, having an opening at a center portion which a conductor penetrates, including a plurality of stacked layers each having an opening at a center portion which a conductor penetrates, having at least three sheets of first layers formed of core material, and at least two sheets of second layers formed of prepreg material each arranged between respective two of the first layers, a plurality of first metal foils and a plurality of second metal foils, each extended in the shape of radiating from a center that is approximately the center of the opening, mounted on an outer side and an inner side of a first outer layer formed of the core material, respectively, a first winding formed by electrically connecting the first metal foils and the second metal foils with first plated through holes penetrating the first outer layer in a thickness direction, a plurality of third metal foils and a plurality of fourth metal foils, each extended in the shape of radiating from a center that is approximately the center of the opening, mounted on an inner side and an outer side of a second outer layer formed of the core material, respectively, a second winding formed by electrically connecting the third metal foils and the fourth metal foils with second plated through holes penetrating the second outer layer in a thickness direction, the second winding formed as a mirror image of the first winding, one of the second metal foils and one of the third metal foils being electrically connected with a third plated through hole penetrating the plurality of stacked layers of the printed circuit board in a thickness direction, the first metal foils and the fourth metal foils being electrically disconnected with the third plated through hole, and thereby, the first winding and the second winding being electrically connected in series, (b) a sensor unit, comprising, an analog-to-digital converter which converts the analog-voltage signal into a digital electric signal, and an electric-to-optic converter which converts the digital electric signal into a digital optical signal, and (c) an optic transmission means which transmits the digital optical signal to upstream system.

According to still another aspect, there is provided a current transformer, comprising, (a) a Rogowski coil which detects an alternating current of a main circuit of power distribution equipment or substation main circuits equipment, and outputs a measure of the alternating current as an analog-voltage signal, the Rogowski coil comprising, a printed board of multilayer type comprising three conducting layers of interconnections, having an opening at a center portion which a conductor penetrates, a plurality of first metal foils each extended in the shape of radiating from a center that is approximately the center of the opening, mounted on a first outer side of surface of the printed circuit board, a plurality of second metal foils each extended in the shape of radiating from a center that is approximately the center of the opening, mounted on a second outer side of surface of the printed circuit board, a winding formed by electrically connecting the first metal foils and the second metal foils with plated through holes penetrating the printed circuit boards in a thickness direction, a return circuit line formed by a circular metal foil with a center that is approximately the center of the opening, mounted on an inner conductive layer of the printed circuit boards, and the winding and the return circuit line being connected in series, (b) a sensor unit, comprising, an analog-to-digital converter which converts the analog-voltage signal into a digital electric signal, and an electric-to-optic converter which converts the digital electric signal into a digital optical signal, and (c) an optic transmission means which transmits the digital optical signal to upstream system.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE INVENTION

Figure 1:
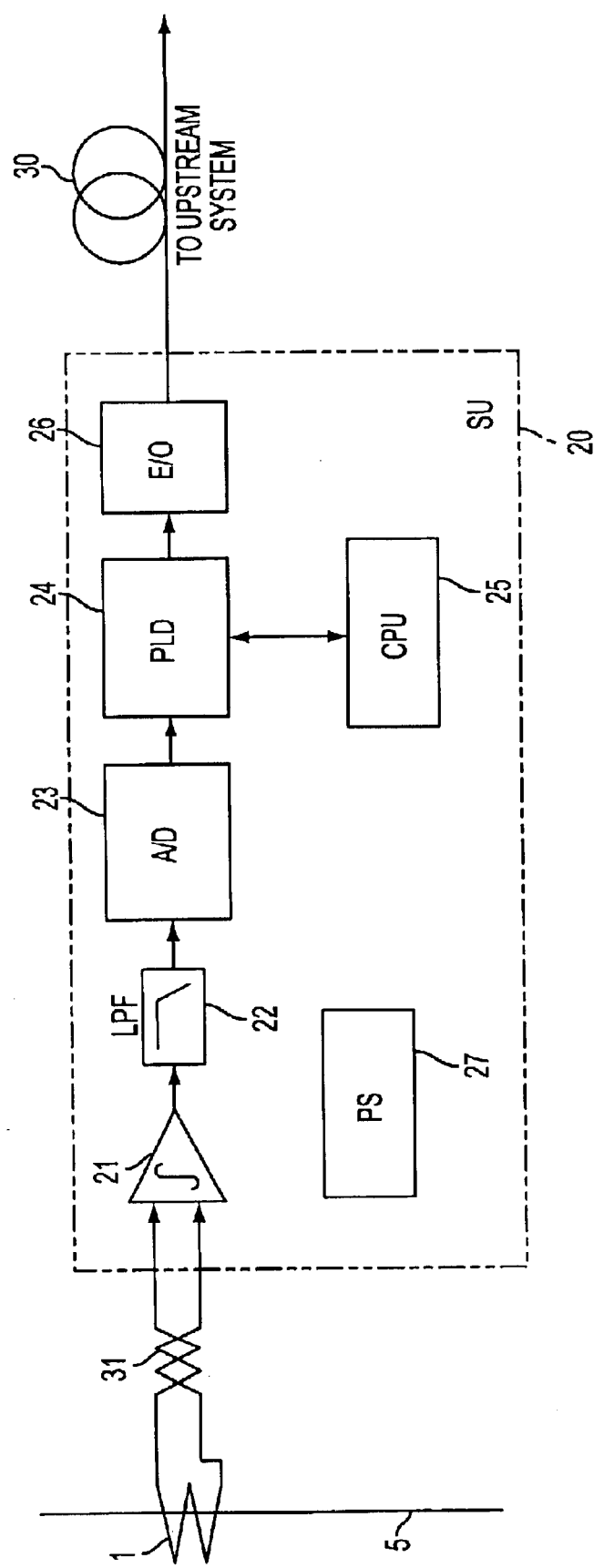
FIG. 1 is a block diagram showing a current transformer in accordance with a first embodiment of this invention.

Referring now to the drawings, wherein like reference numerals designate identical or corresponding parts throughout the several views, an embodiment of this invention will be described below.

(First Embodiment)

FIG. 1 shows a block diagram of a current transformer in accordance with a first embodiment. This current transformer shown in this figure has a Rogowski coil 1 attached with a penetrating conductor 5, a sensor unit (SU) 20 arranged in the periphery of the Rogowski coil 1, and an optic transmission means 30 constituting an optic transmission path. A twisted-pair electric wire 31 connects the Rogowski coil 1 and the sensor unit 20.

The sensor unit 20 has an integrator 21 which carries out analog signal processing of an analog-voltage signal input from the Rogowski coil 1 through the twisted-pair electric wire 31, a low-pass filter (LPF) 22 which cuts off higher harmonics in order to reduce overlapping alias error before analog-to-digital conversion, an analog-to-digital converter (A/D converter) 23 which converts an analog-voltage signal into a digital electric signal, a programmable logic device (PLD) 24 which processes the digital electric signal, a central processing unit (CPU) 25, an electric-to-optic converter (E/O converter) 26 which converts from the digital electric signal into a digital optical signal and outputs the digital optical signal, and a power supply circuit 27.

The power supply circuit 27 provides a voltage necessary for processing of the sensor unit 20 such as DC ±5 V or DC ±3.3 V from a voltage supplied from, for example, a common power source (not illustrated) in an electric power installation such as DC 110 V, DC 48 V or DC 220 V (which is generally suited to a standard power source of an electric power installation). Moreover, the sensor unit 20 may have a backup power supply such as a battery (not illustrated).

In addition, although the Rogowski coil 1 connected to the sensor unit 20 is illustrated as one in this figure, the input is not necessarily just one channel. That is, for example, for a three phase encapsulated GIS (gas insulation switch), three phases, i.e., phase U, phase V and phase W, of outputs of the Rogowski coils may be input to one sensor unit. In this case, the sensor unit 20 is constituted so that a number of analog input circuits having the integrator 21 and the LPF 22 corresponds to a number of input channels, and one A/D converter 23 performs analog-to-digital conversion with an analog multiplexer (not illustrated) which switches one of the multiple analog inputs to common output in turn by turn. The PLD 24 and the downstream structure are the same as in the case of one channel input. In addition, each output terminal of the Rogowski coils 1 and each input terminal of the sensor unit 20 with multi-channel components are connected one-on-one by a twisted-pair electric wire 31, respectively.

The optic transmission means 30 transmits a digital optical signal from the sensor unit 20 into upstream system such as a protection control unit. Although not illustrated, an optical transmission channel may be composed by either way of a point-to-point transmission channel, or connected through local area network (LAN).

Figure 2:
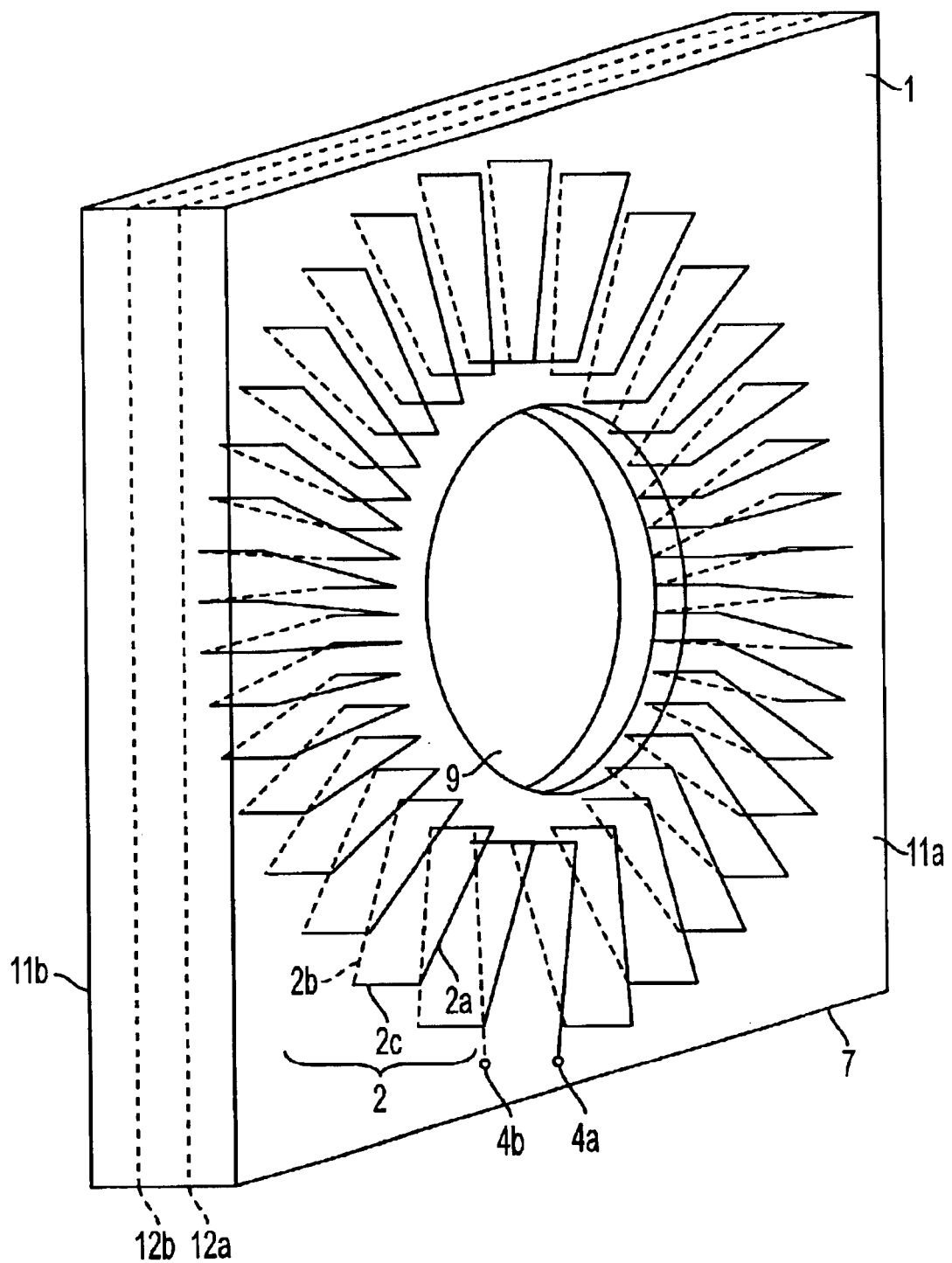
FIG. 2 is an outline perspective view showing a structure of a Rogowski coil of a current transformer in a first embodiment of this invention.

Next, a structure of the Rogowski coil in this first embodiment is explained with reference to FIG. 2. FIG. 2 is a perspective view showing the Rogowski coil of this embodiment. In this figure, the Rogowski coil 1 has a printed circuit board 7 of multiplayer type with four conducting layers, having an opening 9 which is penetrated by a conductor in a center portion. Front face metal foils 2a and reverse face metal foils 2a' are mounted on one side 11a of an outer surface of this printed circuit board 7 (which is called a printed circuit board front face 11a) and a reverse side 11b thereof (which is called a printed circuit board reverse face 11b), respectively, and internal-layer metal foils 2b and 2b' are mounted on conducting internal layers 12a, 12b, inside the printed circuit board, respectively, which trisect the printed circuit board 7 in a thickness direction. In FIG. 2, the reverse face metal foils 2a' and the internal-layer metal foils 2b' are abbreviated for simplification. These four layers of the metal foils 2a, 2a', 2b and 2b' are formed in a plurality of straight lines each extended in the shape of radiating from a center that is approximately the center of the opening 9, respectively.

The front face metal foils 2a on the printed circuit board front face 11a and the internal-layer metal foils 2b on the conducting internal layer 12a adjacent to the front face metal foils 2a are electrically connected with plated penetration holes 2c penetrating the printed circuit board 7. The reverse face metal foils 2a' (not illustrated) on the printed circuit board reverse face 11b and another internal-layer metal foils 2b' (not illustrated) on the conducting internal layer 12b adjacent to the reverse face metal foils 2a' are also electrically connected with plated penetration holes 2c' (not illustrated) penetrating the printed circuit board 7. Thereby, two windings 2 and 2' (not illustrated) are formed on the printed circuit board 7 as a pair of enantiomeric isomers of each other (i.e., they are mirror images of each other).

Furthermore, ends of the two windings 2 and 2' of the printed circuit board front face 11a side and the printed circuit board reverse face 11b side, are extracted as terminals 4a (The terminal 4a of the printed circuit board reverse face 11b side is not illustrated.). Ends of the of the two windings 2, 2' of the conducting internal layer 12a side and the conducting internal layer 12b side, are extracted as terminals 4b (The terminal 4b of the metal foil of the conducting internal layer 12b side is not illustrated.), and the two windings 2, 2' are connected in series between two connection terminals 4b, 4b.

Figure 11:
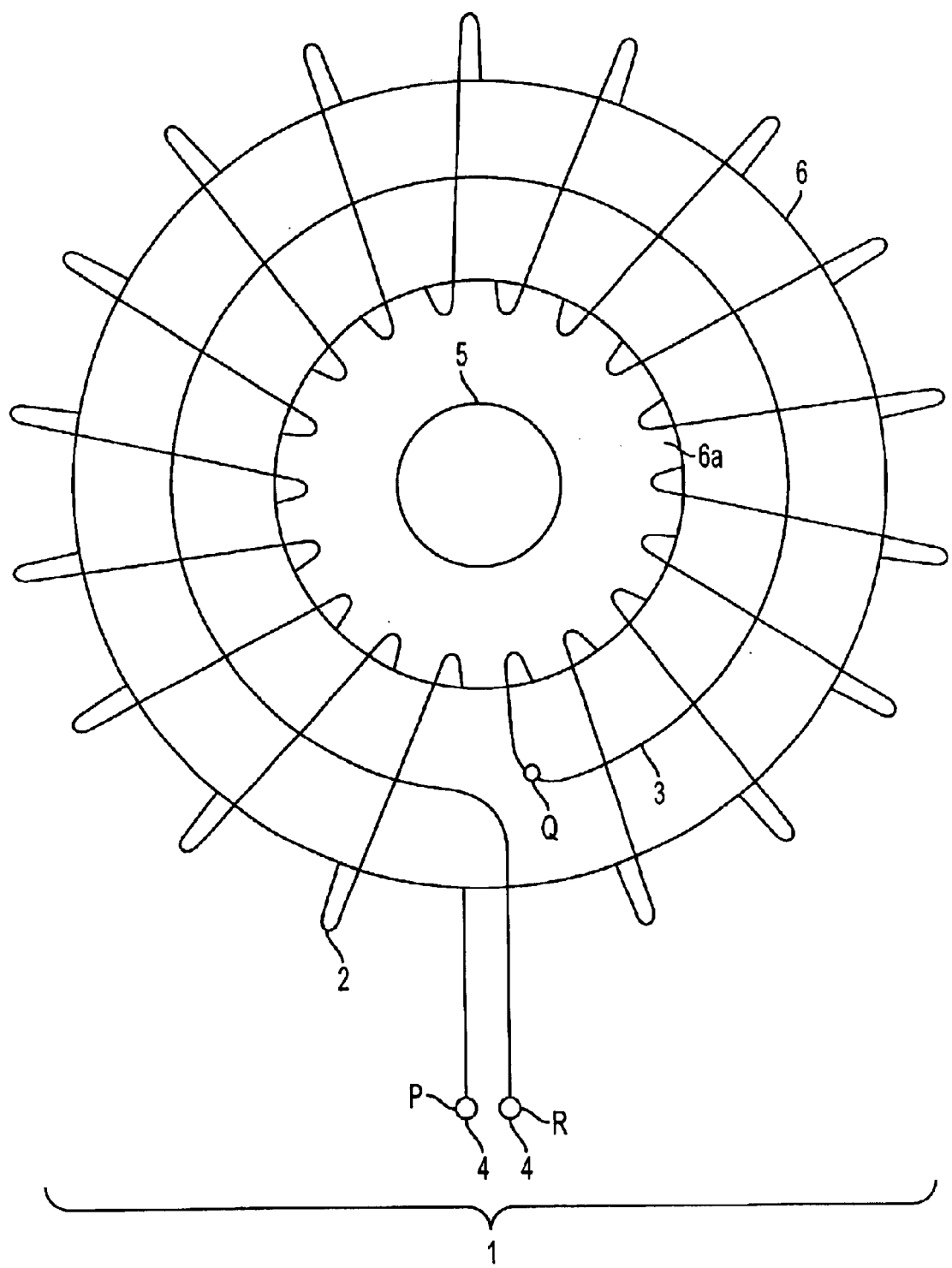
FIG. 11 is a front view showing a structure of a conventional common Rogowski coil.

That is, a part of the winding 2 arranged between the printed circuit board front face 11a and the conducting internal layer 12a corresponds to the conventional winding 2 shown in FIG. 11, and a part of the winding 2' (not illustrated) arranged between the printed circuit board reverse face 11b and the conducting internal layer 12b corresponds to the conventional return circuit line 3 shown in FIG. 11.

Figure 3:
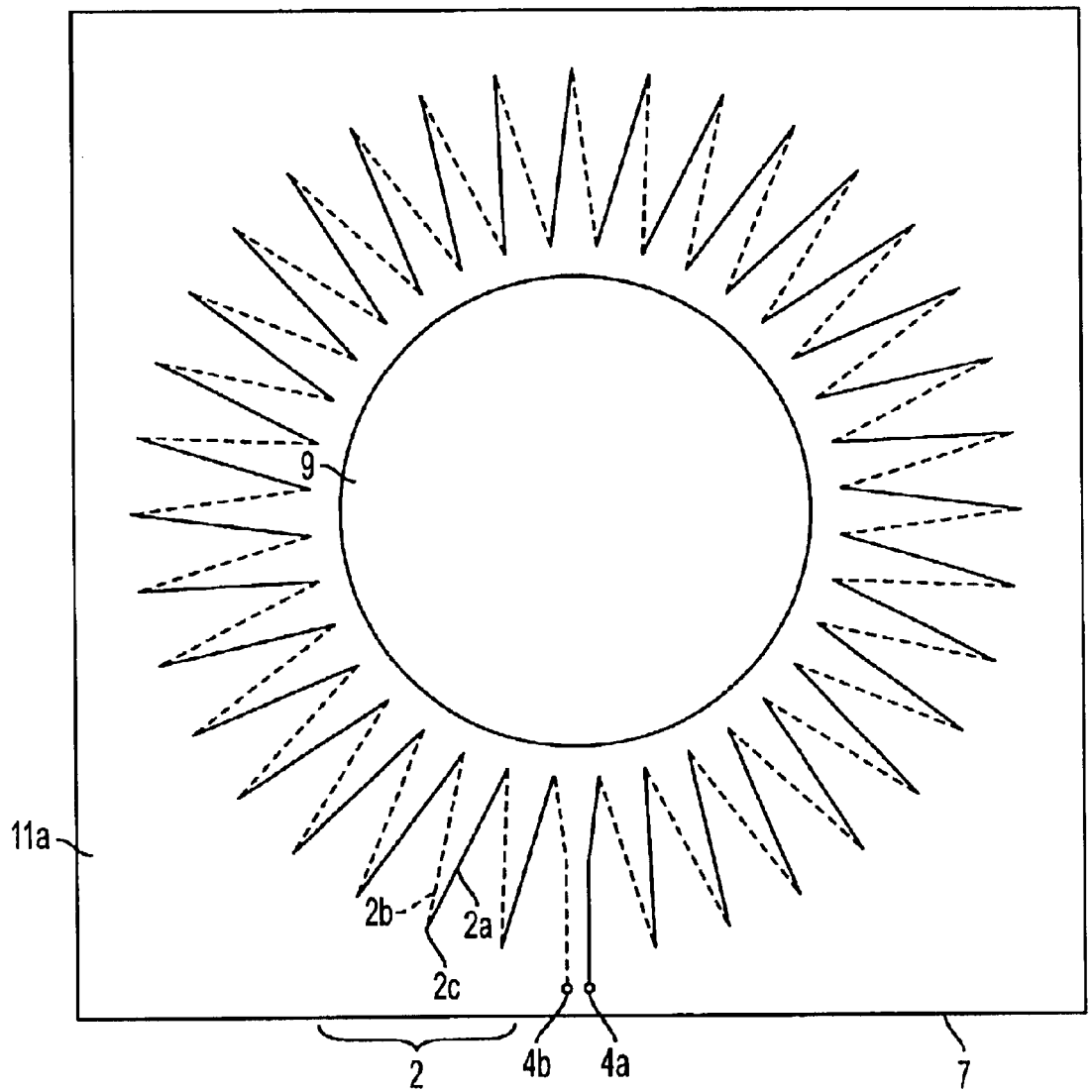
FIG. 3 is an outline front view showing a structure of a printed circuit board of a current transformer in a first embodiment of this invention.

FIG. 3 shows an outline of the printed circuit board 7 viewed from the printed circuit board front face 11a side. In FIG. 3, a solid line shows the front face metal foil 2a mounted on the printed circuit board front face 11a and a dashed line shows conducting internal layer metal foil 2b mounted on the conducted internal layer 12a. The front face metal foils 2a on the printed circuit board front face 11a and the conducting internal layer metal foil 2b on the conducting internal layer 12a are formed in a plurality of straight lines each extended in the shape of radiating from a center that is approximately the center of the opening 9, respectively. In addition, although not illustrated, the reverse face metal foils 2a' on the printed circuit board reverse face 11b and the conducting internal layer metal foils 2b' on the conducting internal layer 12b are formed in a plurality of straight lines each extended in the shape of radiating from a center that is approximately the center of the opening 9, respectively. In addition, they are mirror images of the front face metal foils 2a on the printed circuit board front face 11a and the conducting internal layer metal foils 2b on the conducting internal layer 12a, respectively.

According to this current transformer of the first embodiment, the following actions and effects can be provided. The output voltage of the Rogowski coil 1 is an analog-voltage signal proportional to a differentiation value of an alternating current of a main circuit flowing in the conductor 5, and the output voltage is input into the sensor unit 20 through the twisted-pair electric wire 31. The analog-voltage signal input into the sensor unit 20 is integrated by the integrator 21 to provide an analog electric signal proportional to the alternating current of the main circuit. Next, the low-pass filter 21 reduces higher harmonics of the signal, which causes a overlapping alias error, and thereafter the signal is converted into a digital electric signal by the A/D converter 23.

PLD 24 and CPU 25 process the digital electric signal. That is, PLD 24 processes to generate a timing signal (synchronized signal) of the A/D converter 23, to generate a control signal, and exchanges data with CPU 25, and so on. CPU 25 changes a digital electric signal into a transmission format of, for example, using the Manchester encoding. In the present circumstances, the transmission format can be added with a cyclic redundancy check (CRC) code or a reversal dual redundant code, etc. for improving transmission reliability. The digital electric signal processed by PLD 24 and CPU 25 is changed into a digital optical signal by the E/O converter 26, and thereafter transmitted to upstream system, such as a protection unit or a control unit, through the optic transmission means 30.

Figure 12:
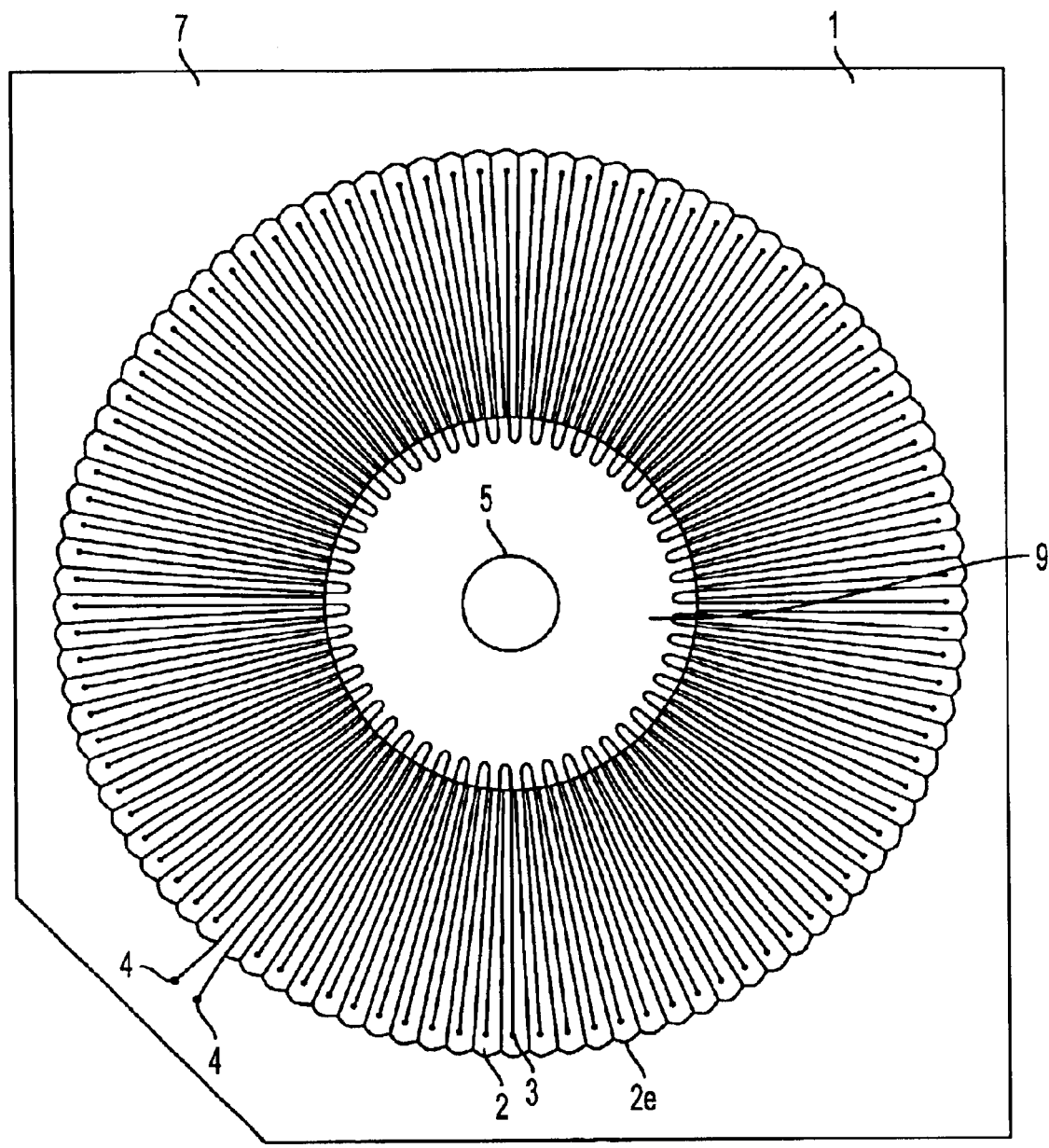
FIG. 12 is a front view showing a structure example of another conventional Rogowski coil.
Figure 14:
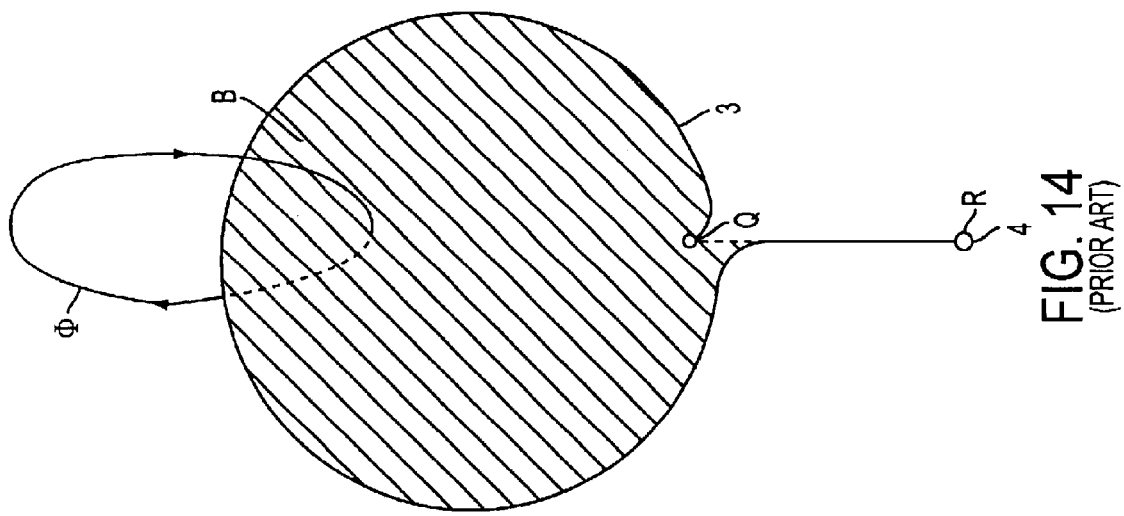
FIG. 14 is a pattern diagram that explains a state where an external magnetic field interlinks to a return circuit line in the Rogowski coil shown in FIG. 11.
Figure 13:
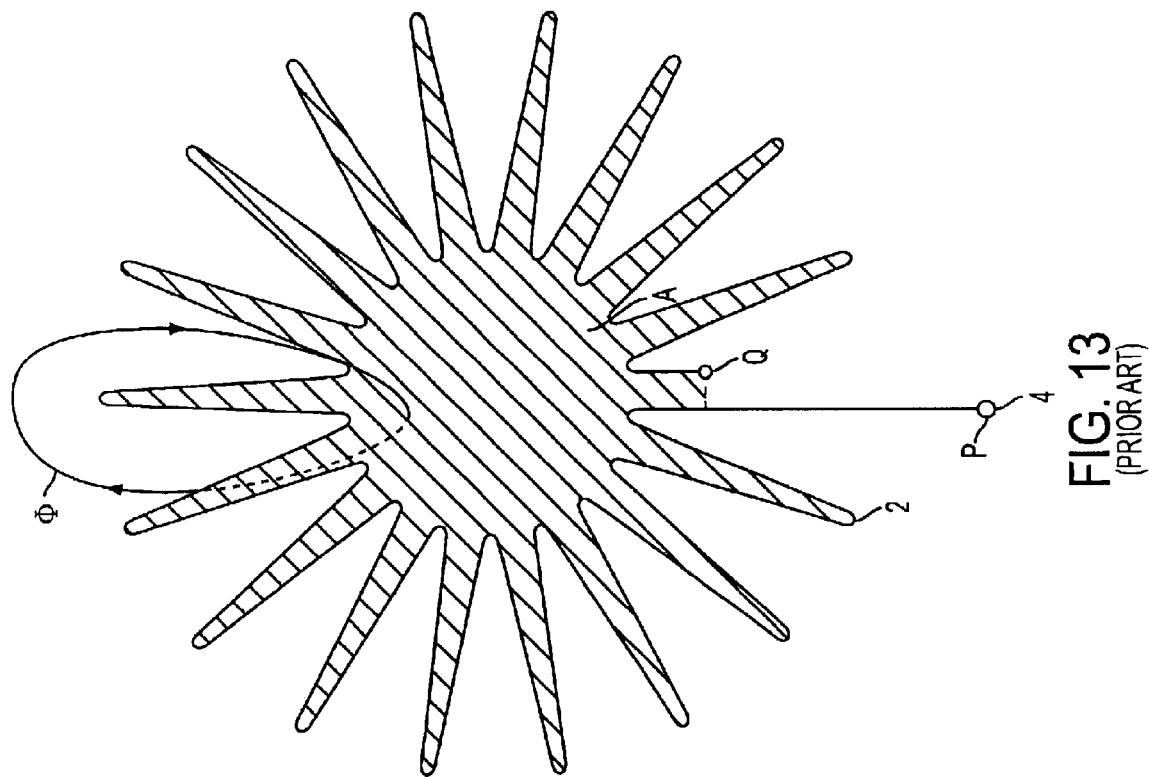
FIG. 13 is a pattern diagram that explains a state where an external magnetic field interlinks to a winding in the Rogowski coil shown in FIG. 11.

Since the Rogowski coil in this embodiment comprises printed circuit boards, the secondary output voltage is about 100 mA/kV, which is as minute as that of the conventional Rogowski coil shown in FIG. 12. However, according to this embodiment, since the sensor unit 20 for converting the secondary output voltage into the digital optical signal is arranged so close to the printed circuit board that the effect of the external noise can be disregarded, the transmission distance as an analog electric signal is sufficiently short, that is, preferably at most one meter, and thus the problem of degradation of signal quality due to the influence of the external noise can be avoided. Especially, since the Rogowski coil 1 and the sensor unit 20 are connected by the twisted-pair electric wire 31, the influence of electromagnetic induction by the external magnetic field to a minute analog-voltage being transmitted from the Rogowski coil 1 to the sensor unit 20, can be reduced.

Since the digital optical signal is transmitted between the sensor unit 20 and upstream system such as a protection unit or a control unit of an electric power installation main control building, then there is no signal degradation by the influence of the noise even in long-distance transmission, therefore, a high quality measure of alternating current can be provided to the protection unit or the control unit and so on.

In addition, CPU 25 may apply a digital filter to the digital electric signal which expresses the measure of alternating current of the main circuit. And software running on the CPU 25 may be provided so that variation of the Rogowski coils 1 and analog circuits of the sensor unit 20 such as the integrator, low-pass filter circuits, can be compensated in terms of sensitivity compensation and/or phase compensation. Moreover, effective values of alternating current of the main circuit have been calculated in the upstream system such as BCU (bay control unit) conventionally, however, in this embodiment, CPU 25 may calculate such effective values and transmit the result to the upstream system.

Moreover, CPU 25 may perform temperature compensation by arranging a temperature sensor (not illustrated) in the sensor unit 20. Since the sensor unit 20 is at the periphery of the Rogowski coil 1 in this embodiment, the temperature measured in the sensor unit 20 can be assumed to equal to an ambient air temperature of the Rogowski coil 1, and the temperature compensation can be accurately performed.

Figure 16:
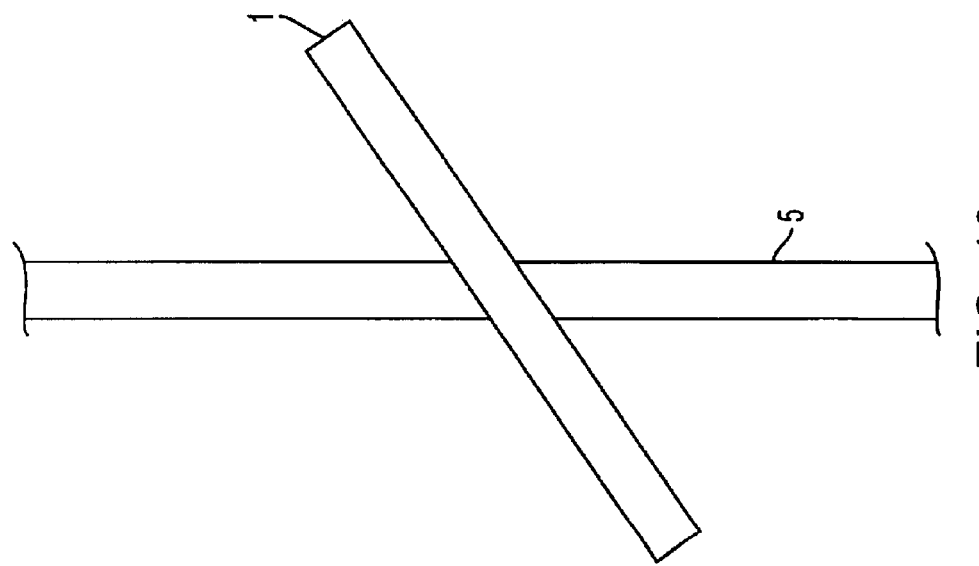
FIG. 16 is a pattern diagram for explaining another example of factors that generate an external magnetic field.
Figure 15:
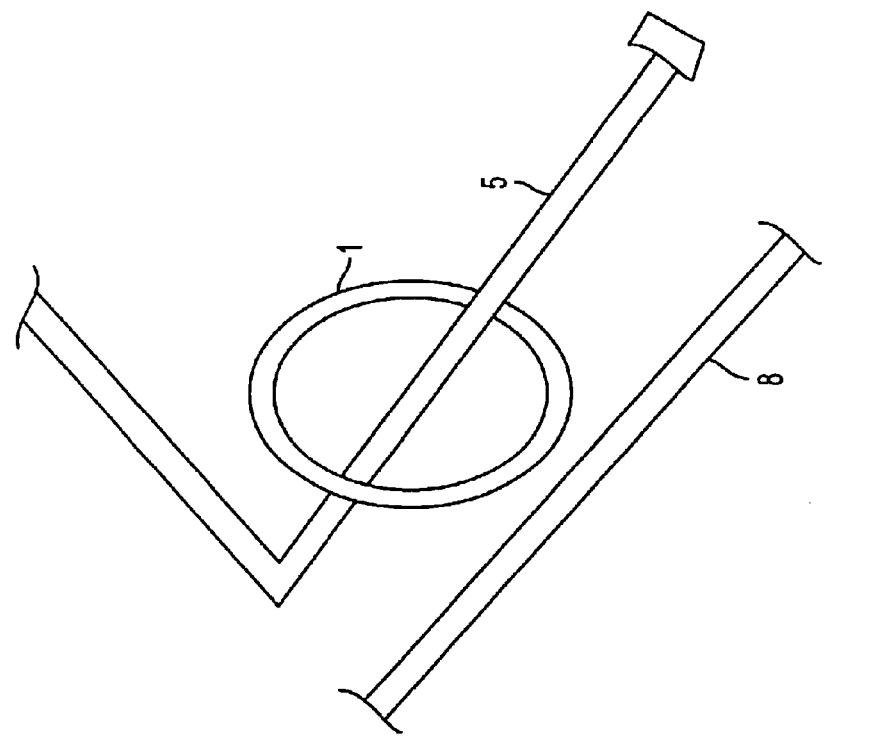
FIG. 15 is a pattern diagram that explains an example of factors that generate an external magnetic field.

According to the above-mentioned current transformer with the Rogowski coil in the first embodiment of this invention, in the condition shown in FIGS. 15 and 16, where conductor 5 has a bent portion, or the conductor 8 exists outside the Rogowski coil 1, or the conductor 5 is inclined to the Rogowski coil, when an external magnetic field in a direction penetrating the opening 9 of the center portion of the printed circuit board 7 exists due to the arrangement of the Rogowski coil 1, the magnetic flux Φ interlinking to one winding is common to that interlinking to another winding as a mirror image of the respective one winding. Accordingly, two voltages generated in two windings due to this magnetic flux Φ, respectively, has the same measure and, the polarity of one voltage is reverse of that of another, and thus two voltage can be completely offset. Therefore, the influence of an external magnetic field can be prevented effectively, and thus a current measurement can be realized with high accuracy.

Moreover, an input and output circuit which has conventionally been mounted on a protection unit and/or a control unit for connecting to electric power distribution main circuit equipment and/or substation main circuit equipment can be deleted, and all input and output of the protection unit and/or the control unit are performed through transmission means and there is no circuit treating high voltage and large current, thus hardware structure of the protection unit and/or the control unit mainly comprises only a digital calculation processing portion for and/or the control unit mainly comprises only a digital calculation processing portion for processing protection function and/or control function and a communication portion for performing communication processing, therefore, many hardware components can be reduced.

Furthermore, since the current transformer of this embodiment also has a calculation function provided by CPU 25, a part of operation, which has been conventionally performed with the protection unit and/or the control unit, can be executed by proxy, and the operation burden of the protection unit and/or the control unit side can be reduced. Moreover, by partly burdening the calculation which has been conventionally performed in the protection unit and/or the control unit, there occurs a vacant time in CPU of the protection unit and/or the control unit, and thus the protection unit and/or the control unit can perform further advanced protection and/or control calculation function and/ or monitoring function by utilizing the vacant time. Therefore, the protection unit and/or the control unit can additionally perform advanced protection and/or control calculation and/or monitoring functions, and thus performance of a substation protection and control system as a whole can be improved.

(Second Embodiment)

Next, a second embodiment of this invention is explained. The second embodiment provides a more detailed structure of the printed circuit board 7 as mentioned in the first embodiment. Thus the main system composition of a current transformer in accordance with this embodiment is the same as that of the first embodiment, and the explanation is omitted.

Figure 4:
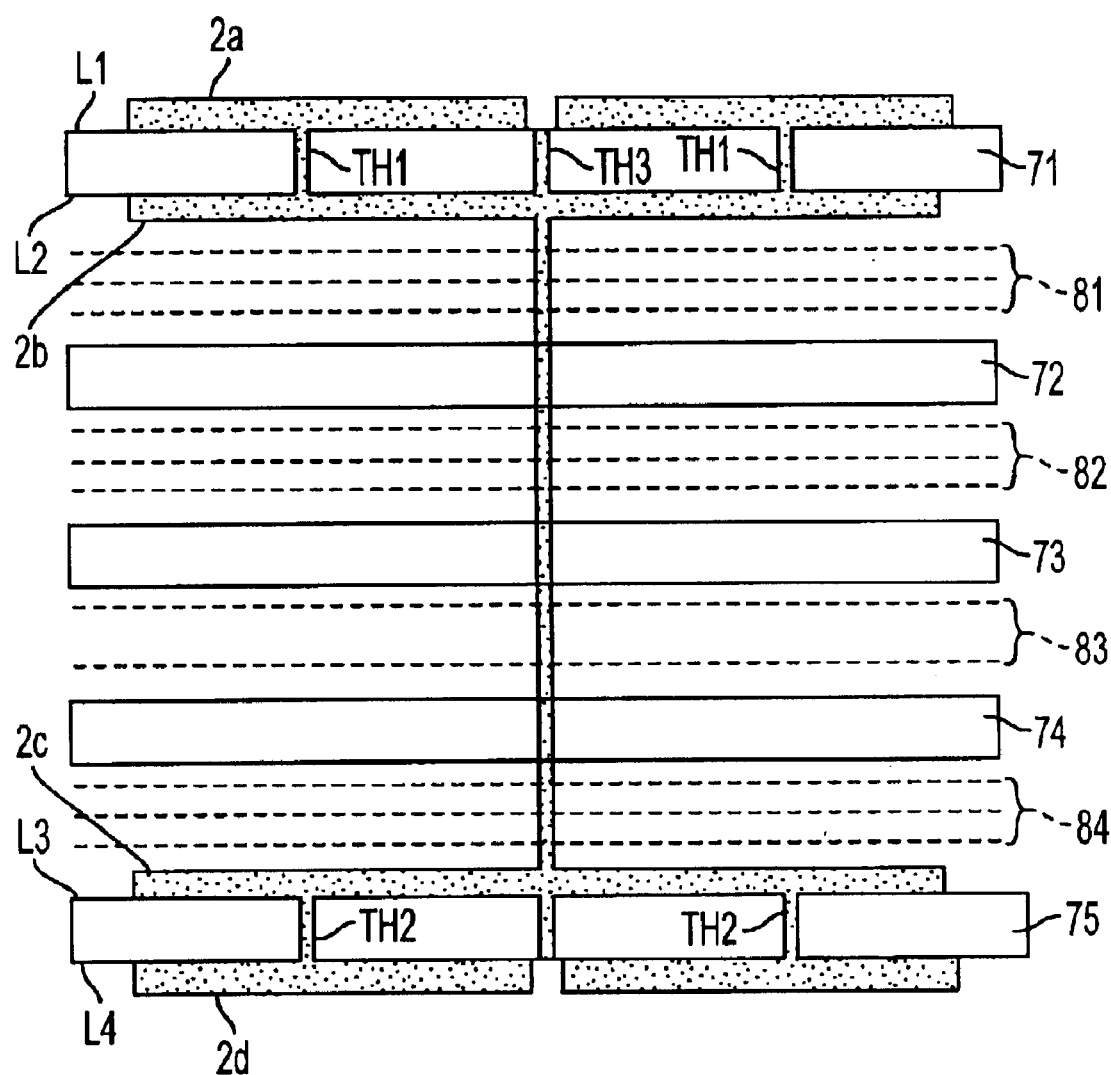
FIG. 4 is an outline sectional view that explains an example of layer structure of a printed circuit board in accordance with a second embodiment of this invention.

FIG. 4 shows a detailed example of layer structure of the printed circuit board. In this embodiment, the printed circuit board is composed of at least three sheets of core materials and at least two sheets of prepreg materials interposed between two sheets of the core materials. In this figure, as an example, the printed circuit board 7 has five sheets of core materials 71, 72, 73, 74, 75 and four pairs of prepreg materials 81, 82, 83, 84, each interposed between two sheets of core materials, that is, a core material 71 is set in outer surface, and a plurality of prepreg materials 81, a core material 72, a plurality of prepreg materials 82, . . . , a core material 75, are build up in turn and alternately in the core material and the prepreg materials. Here, the core material is an exposed fiber glass material which contains thin copper lamination sheets in both sides, and the prepreg materials are adhesives (epoxy) being placed between each pair of the core materials, and the prepreg materials are heated and pressed during manufacture of the printed circuit board.

A plurality of lines of metal foils 2a, 2b, each of which is extended in the shape of radiating from a center that is approximately the center of the opening 9, are arranged on both sides of surface L1, L2 of one core material 71 arranged in one outer side of the printed circuit board 7, respectively. The metal foils 2a on one side of surface L1 and the metal foils 2b on the another side of surface L2 are electrically connected by plated through holes TH1 penetrating the core material 71 in a thickness direction, in order to compose one winding. On the other hand, a plurality of lines of metal foils 2c, 2d, each of which is extended in the shape of radiating from a center that is approximately the center of the opening 9, are arranged both sides of surface L3, L4 of one core material 75 arranged in another outer side of the printed circuit board 7, respectively. The metal foils 2c on one side of surface L3 and the metal foils 2d on the another side of surface L4 are electrically connected by a plated through holes TH2 penetrating the core material 75 in a thickness direction, in order to compose another one winding. One winding formed in the core material 71 and another winding formed in the core material 75 are mirror images of each other.

Moreover, the printed circuit board 7 has a plated through hole TH3 penetrating all core materials 71 through 75 and all of a plurality of prepreg materials 81 through 84, and this plated through hole TH3 electrically connects one of the metal foils 2b of the inner side of surface L2 of the core material 71 and one of the metal foils 2c of the inner side of surface L3 of the core material 75. In ends of the through hole TH3, the metal foils 2a of the outer side of surface L1 of the core material 71 and the metal foil 2d of the outer side of surface L4 of the core material 75 are electrically disconnected, and thus one winding formed in the core material 71 and another winding formed in the core material 75 are electrically connected in series.

Figure 5B:
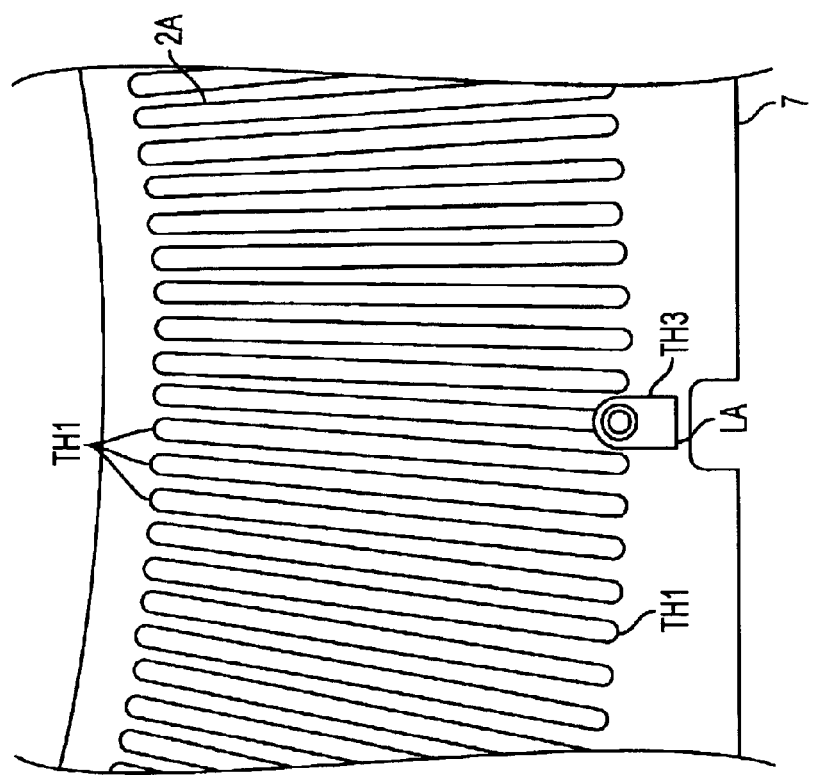
FIG. 5B is a front view enlarging a portion surrounded by a dotted line in FIG. 5A.
Figure 5A:
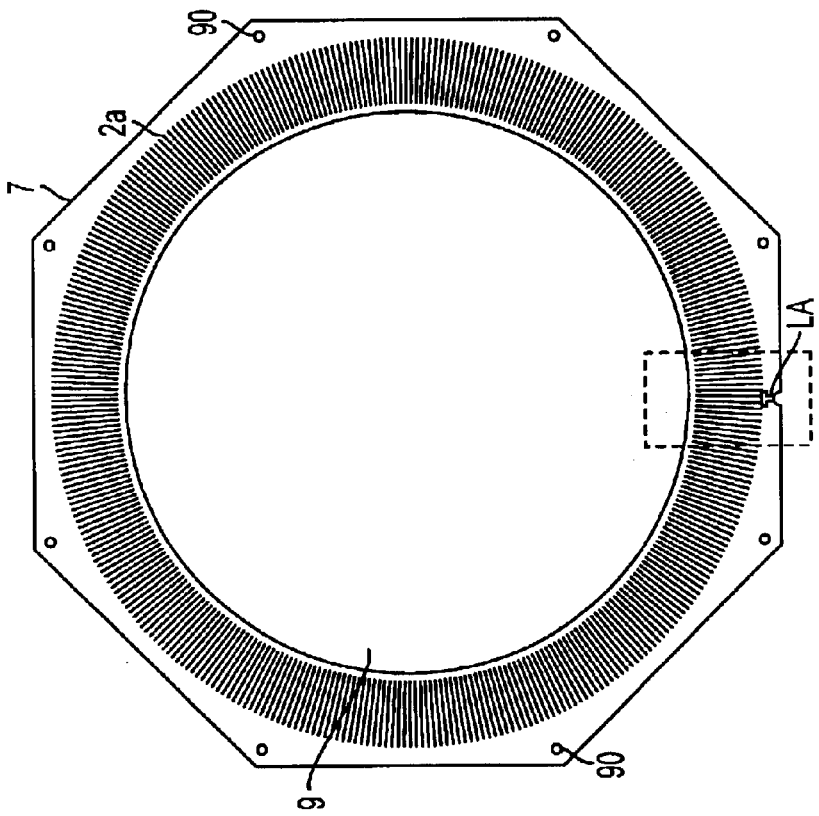
FIG. 5A is a front view showing a structure of a printed circuit board in accordance with a second embodiment of this invention.

Next, a detailed example of insulation between the metal foils 2a of the outer side of surface L1 of the core material 71 and the metal foils 2d of the outer side of surface L4 of the core material 75, is shown with reference to FIGS. 5A and 5B. FIGS. 5A and 5B show a detailed example of an outlined printed circuit board 7, FIG. 5A is a front view as a whole of the printed circuit board 7, and FIG. 5B is a front view enlarged in a portion surrounded by a dotted line in FIG. 5A.

Terminal areas (lands) LA, from which an analog-voltage signal is output, which are arranged on the outer side of surface of the core material 71 and the outer side of surface of the core material 75, respectively, are formed positions symmetrical to each other. The lands LA surround the plated through hole TH3 penetrating the printed circuit board 7, and the lands LA and the plated through hole TH3 penetrating the printed circuit board 7 are electrically insulated. And as shown in FIG. 5A, an outside of a printed circuit board 7 is shaped as a regular octagon, each vertex portion of which has a drilled hole for attachment.

Clearly, the current transformer in the second embodiment constituted as mentioned above can achieve the same effect of that of in the first embodiment. In addition, according to this embodiment, two windings symmetrical in a mirror image each other are formed cheaply on one printed circuit board 7 with general technique of manufacturing printed circuit boards, without using any special means. Moreover, since the windings formed on a printed circuit board 7 can constitute a nearly perfect closed loop without a portion lacking a winding, thus the influence of an external magnetic field can be minimized. In addition, in the symmetrical two windings as enantiomers, one area surrounded by one of the two windings is almost same as that of another winding, thus one magnetic flux Φ interlinking one of the two windings are common with that of another winding. Therefore, the two voltages generated the corresponding to the two windings, respectively, cancel each other and thus the effect of the external magnetic field to current measurement can be prevented or minimized.

Moreover, by arranging the outside of the printed circuit board as a regular octagon, it can be cheaply manufactured by using a linear shape, and an attachment space of the Rogowski coil can be made small compared with another shape such as a square. Especially, the attachment space of this regular octagon is almost as same as that of a circle which is more expensive in manufacturing the printed circuit board.

(Third Embodiment)

Next, a third embodiment of this invention is explained. The third embodiment concerns a modification of a structure of the Rogowski coil 1. The main system structure of a current transformer in accordance with this embodiment is the same as that of the first embodiment, and the explanation is omitted.

Figure 6:
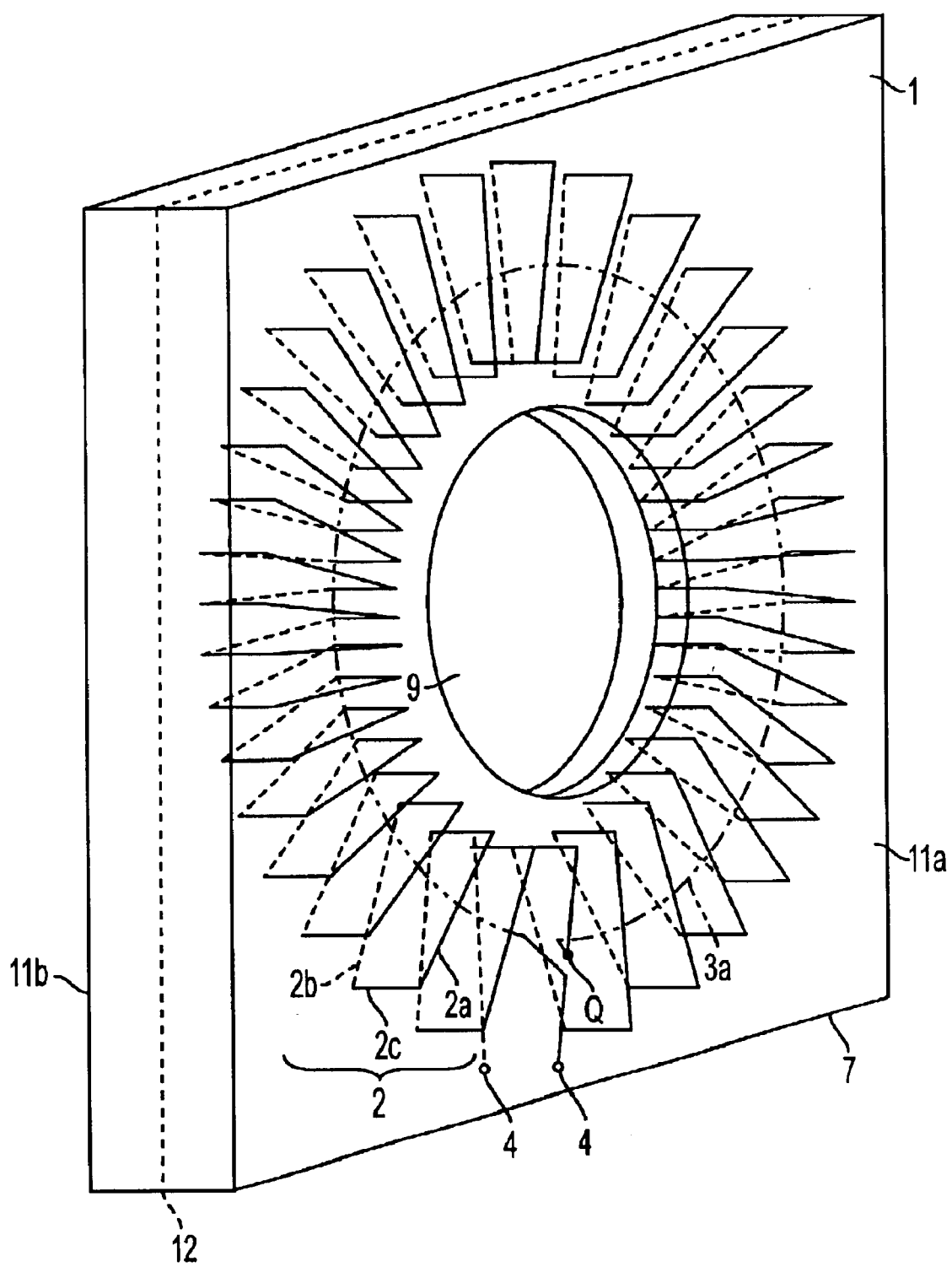
FIG. 6 is an outline perspective view showing a structure of a Rogowski coil of a current transformer in a third embodiment of this invention.

FIG. 6 is an outlined perspective view showing the structure of the Rogowski coil 1 of this embodiment. In the Rogowski coil 1 of this embodiment shown in this figure, front face metal foils 2a and reverse face metal foils 2b are mounted on a printed circuit board front face 11a and a printed circuit board reverse face 11b, respectively, of the printed circuit board 7 of multiplayer type with three conducting layers, having an opening 9, at a center portion penetrated by a conductor. The front face metal foils 2a and the reverse face metal foils 2b are formed a plurality of straight lines each extended in the shape of radiating from a center that is approximately the center of the opening 9, and electrically connected with plated through holes 2c. The front face metal foils 2a, the reverse face metal foils 2b and the plated through holes 2c form one winding 2 on the printed circuit board 7.

Moreover, a circular metal foil 3a with a center being approximately the center of the opening 9 is mounted on a conducting internal layer 12 approximately in a center in a thickness direction of the printed circuit board 7. And this circular metal foil 3a is connected to the winding 2 in series at point Q so that the metal foil 3a is a return circuit line of the winding 2.

Figure 7:
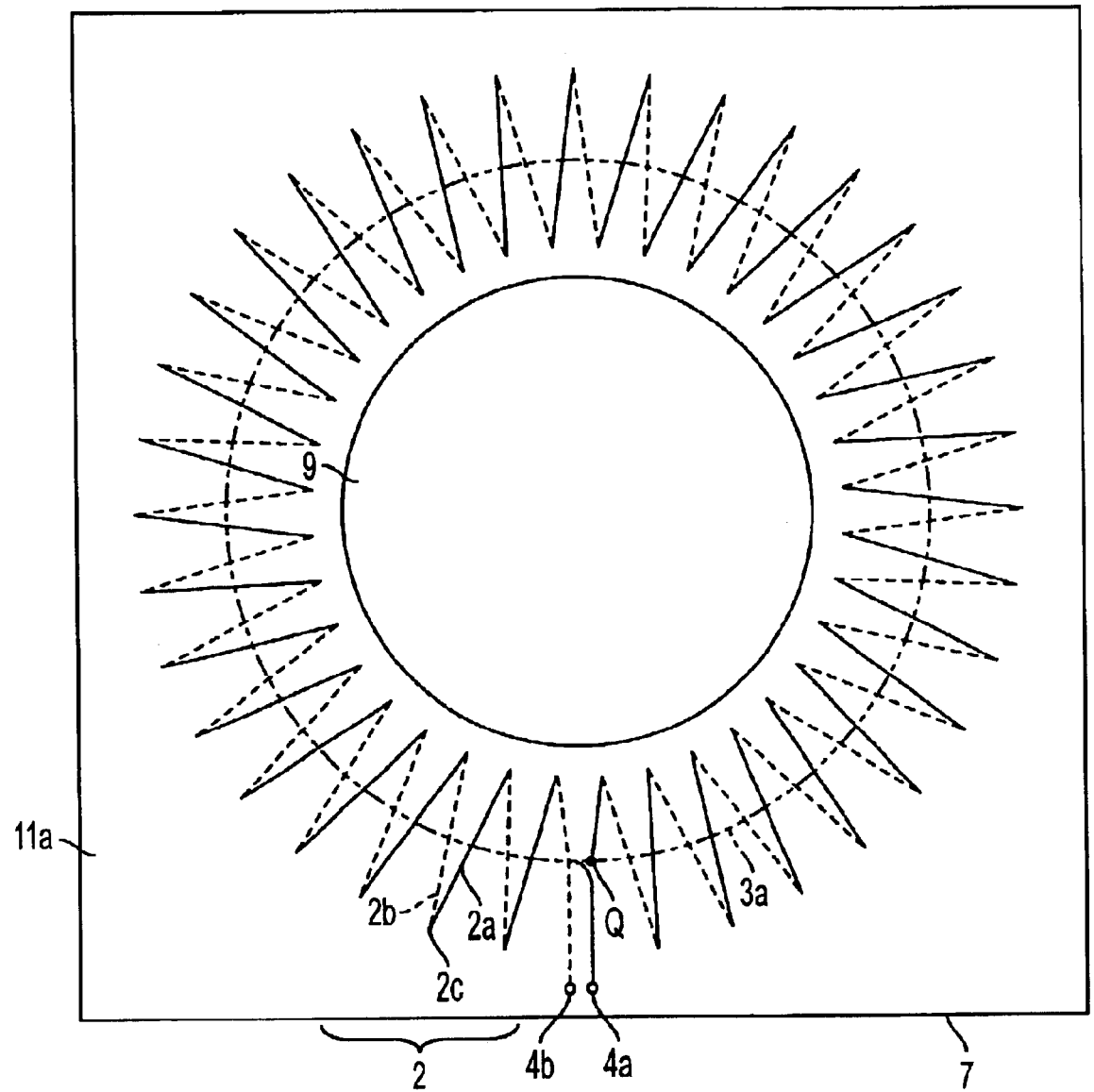
FIG. 7 is an outlined front view showing a structure of a Rogowski coil of a current transformer in a third embodiment of this invention.

FIG. 7 is an outlined view of the printed circuit board 7 viewed from the printed circuit board front face 11a to a centered axial direction. In FIG. 7, a solid line shows the front face metal foil 2a mounted on the printed circuit board front face 11a, a dashed line shows the reverse face metal foil 2b mounted on the printed circuit board reverse face 11b, and a chain double-dashed line shows the circular metal foil 3a mounted on the conducting internal layer 12. The front face metal foils 2a on the printed circuit board front face 11a and the reverse face metal foils 2b on the printed circuit board reverse face 11b are formed in a plurality of straight lines each extended in the shape of radiating from a center that is approximately the center of the opening 9. A radius of the circular metal foil 3a on the conducting internal layer 12 of the printed circuit board 7 is determined so that an area surrounded by the circular metal foil 3a (as a return circuit line) equals an area surrounded by the winding 2. In addition, a general manufacture technique of printed circuit boards makes it possible to manufacture the winding 2 and the circular metal foil 3a in sufficiently exact positions, respectively.

Clearly, the current transformer in the third embodiment constituted as mentioned above can achieve the same effect of that of in the first embodiment. Here, an action and an effect of this embodiment is explained. That is, by suitably adjusting the radius of the circular metal foil 3, the area which the circular metal foil 3 surrounds can be easily arranged equal to the area which the winding 2 surrounds. Since the area which the winding 2 surrounds equals to the area which the circular metal foil 3a surrounds, when an exterior magnetic field penetrating the opening 9 at a center of the printed circuit board 7 exists, a voltage generated in the winding 2 and a voltage generated in the circular metal foil 3a as a return circuit line, due to interlinkage of a magnetic flux Φ by the exterior magnetic field, are almost equal in size and opposite directions in polarity each other, thus these two voltages are cancelled. Therefore, according to this embodiment, an influence of the exterior magnetic field to a voltage between terminals 4, 4 can be prevented effectively.

(Fourth Embodiment)

Next, a fourth embodiment of this invention is explained. The fourth embodiment concerns a modification of a structure of the Rogowski coil 1. The main system structure of a current transformer in accordance with this embodiment is the same as that of the first embodiment, and the explanation is omitted.

Figure 8:
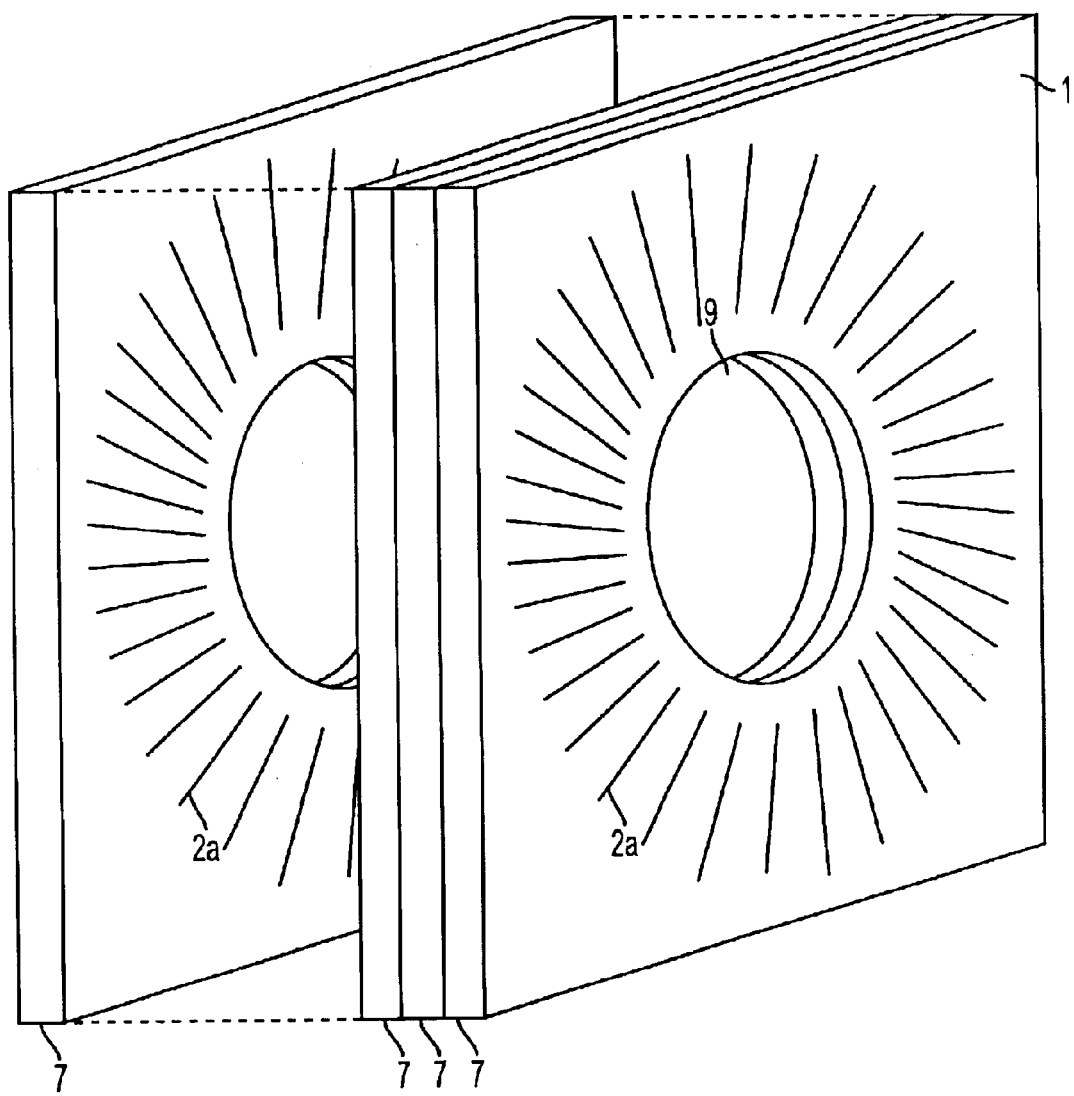
FIG. 8 is an outlined perspective view showing a structure of a Rogowski coil of a current transformer in a fourth embodiment of this invention.

FIG. 8 is a perspective view showing a structure of a Rogowski coil in this embodiment. In this figure, a plurality of the printed circuit boards 7, which are either one of the above-mentioned first to third embodiments, are fixed to each other so that central axes of openings 9 of a plurality of printed circuit boards 7 are aligned. Windings arranged on the printed circuit boards 7, 7, . . . , are arranged in series.

Clearly, the current transformer in the fourth embodiment constituted as mentioned above can achieve the same effect of that of in the first embodiment. Here, an action and an effect of this embodiment is explained. That is, as an output voltage of this Rogowski coil 1, an output of each printed circuit board 7 is added, and an output voltage generated as a whole per unit current and unit frequency is multiplied by a number of sheets of the printed circuit boards 7. Accordingly, in this embodiment, as well as the relation that the area the winding surrounds is equal to the area the return circuit line surrounds, the output voltage per unit current and unit frequency, i.e., sensitivity of the Rogowski coil, can be adjusted. Therefore, the output voltage of a level suitable for processing the sensor unit 20 can be easily designed while preventing an influence of an external magnetic field to current measurement.

Figure 9:
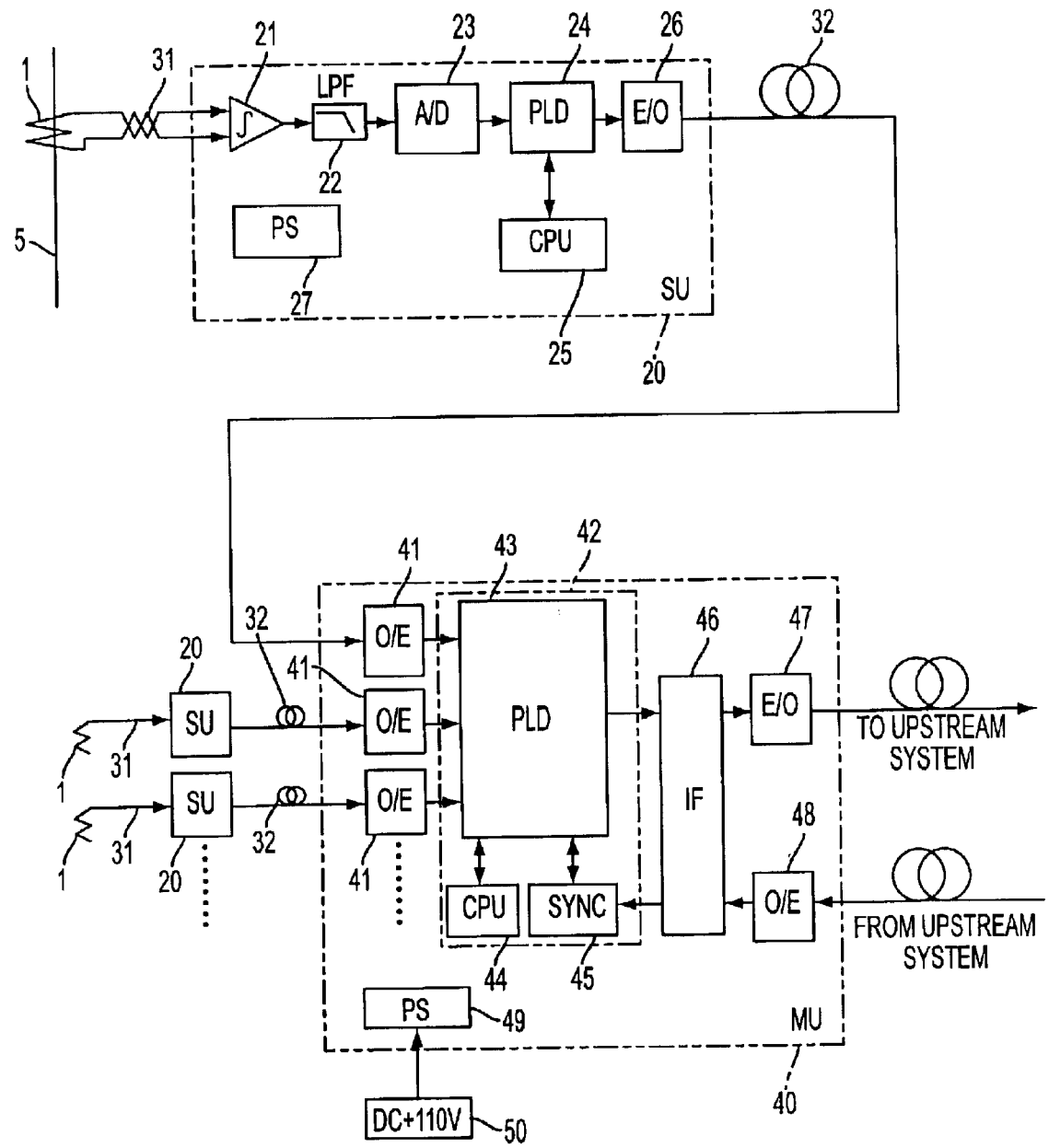
FIG. 9 is a block diagram showing a current transformer in accordance with a fifth embodiment of this invention.

Next, a fifth embodiment of this invention is explained. FIG. 9 shows a block diagram of a current transformer in accordance with a fifth embodiment. The current transformer shown in this figure is composed of Rogowski coils 1 attached with a penetrating conductor 5, sensor units 20 each of which is arranged adjacent to the respective Rogowski coils 1, optic transmission means 32 constituting an optic transmission path, and a merging unit (MU) 40 for merging a plurality of digital optical signals transmitted from the plurality of sensor units 20. In this figure, the structure of the Rogowski coil 1 may be any of the Rogowski coils of the first to fourth embodiments and the structure of the sensor unit 20 is the same as that shown in FIG. 1 explained in the first embodiment, thus their explanations are omitted.

An example of structure of the merging unit 40 is discussed with reference to this figure. Each of the sensor units 20 are connected with the merging unit 40 by the respective optic transmission means 32. The merging unit 40 is mainly composed of an optic-to-electric converter (O/E converter) 41 which converts an inputted digital optical signals outputted from the respective sensor unit 20 into a second digital electric signal, an merging means 42 which merges a plurality of the second digital electric signals to generate a merged electric transmission signal, a communication interface 46 that communicates with upstream system, a second electric-to-optic converter (second E/O converter) 47 which converts the merged electric transmission signal into a second digital optical signals, and a power supply circuit 49, and so on.

The merging means 42 has PLD 43, CPU 44, and a synchronizing means 45, and so on. An optic-to-electric converter (O/E converter) 48 linking to upstream system converts a synchronizing signal outputted from the upstream system as a optical signal into an electric synchronizing signal. The power supply circuit 49 provides a voltage necessary for processing of the merging unit 40 such as DC ±5 V or DC ±3.3 V from a voltage supplied from, for example, a common power source 50 in an electric power installation such as DC 110 V (or DC 48 V or DC 220 V, which is generally suited to a standard power source of an electric power installation.). Moreover, the merging unit 40 may have a backup power supply such as a battery (not illustrated).

A treatment of a plurality of digital optical signals, including information of measure of alternating current, from the sensor units 20 linked to the merging unit 40, has several variations. For example, the digital optical signals may be merged into an merged transmission signal by the unit of bay, such as line bay, or by the unit of zone of protection and/or control, or the signals may be merged into a plurality of merged transmission signals by the unit of zone of protection and/or control. In the merging of the merged transmission signal by the merging unit 40, the merged signal is not limited to a certain regular format, but in a format most suitable according to layout of a substation or system configuration of a protection unit and/or a control unit, and so on.

According to the current transformer in the fifth embodiment of this invention with the above-mentioned structure, following actions and effects can be acquired. The actions of the Rogowski coil 1 and the sensor unit 20 are same as those of in the first to fourth embodiment mentioned above, and their explanations are omitted. In the merging unit 40, each O/E converter 41 receives the respective digital optical signal outputted from the respective sensor units 20, and converts the digital optical signal into the second digital electric signal. And the merging means 42 merges the second digital electric signals and generates a merged electric transmission signal. This merged electric transmission signal is converted into the second digital optical signal by the communication interface 46 and the E/O converter 47, thus the second digital optical signal is transmitted into upstream system such as a protection unit or a control unit.

Next, an action of the merging means 42 is explained in detail. The second digital electric signal converted by the O/E converter 41 is inputted into the PLD 43, where data processing is performed. Here the PLD 43 checks the CRC code or the reversal dual redundant code, and detects a transmission error if there is the transmission error. The synchronizing means 45 receives a base signal for time synchronization and base time data and extracts and generates a sampling synchronization signal and time data for time stamps.

The CPU 44 extracts a digital value of measure of alternating current out of the second digital electric signals received from the sensor units 20, and operates synchronization compensation calculation to correct a deviance of sampling synchronization based on the sampling synchronization signal, and generates a merged electric transmission signal by adding necessary information such as the time stamps and the CRC code to the digital value of alternating current after the synchronization compensation calculation. The CPU 44 also monitors abnormality of the sensor units 20, monitors abnormality of the merging unit 40 by self-monitoring, and outputs an alarm to the upstream system when an abnormality is detected. In addition, the monitoring abnormality of the sensor unit 20 means, for example, monitoring abnormality of a power source of the sensor unit 20, monitoring accuracy of the A/D converter 23, or monitoring of analog circuits.

Figure 10:
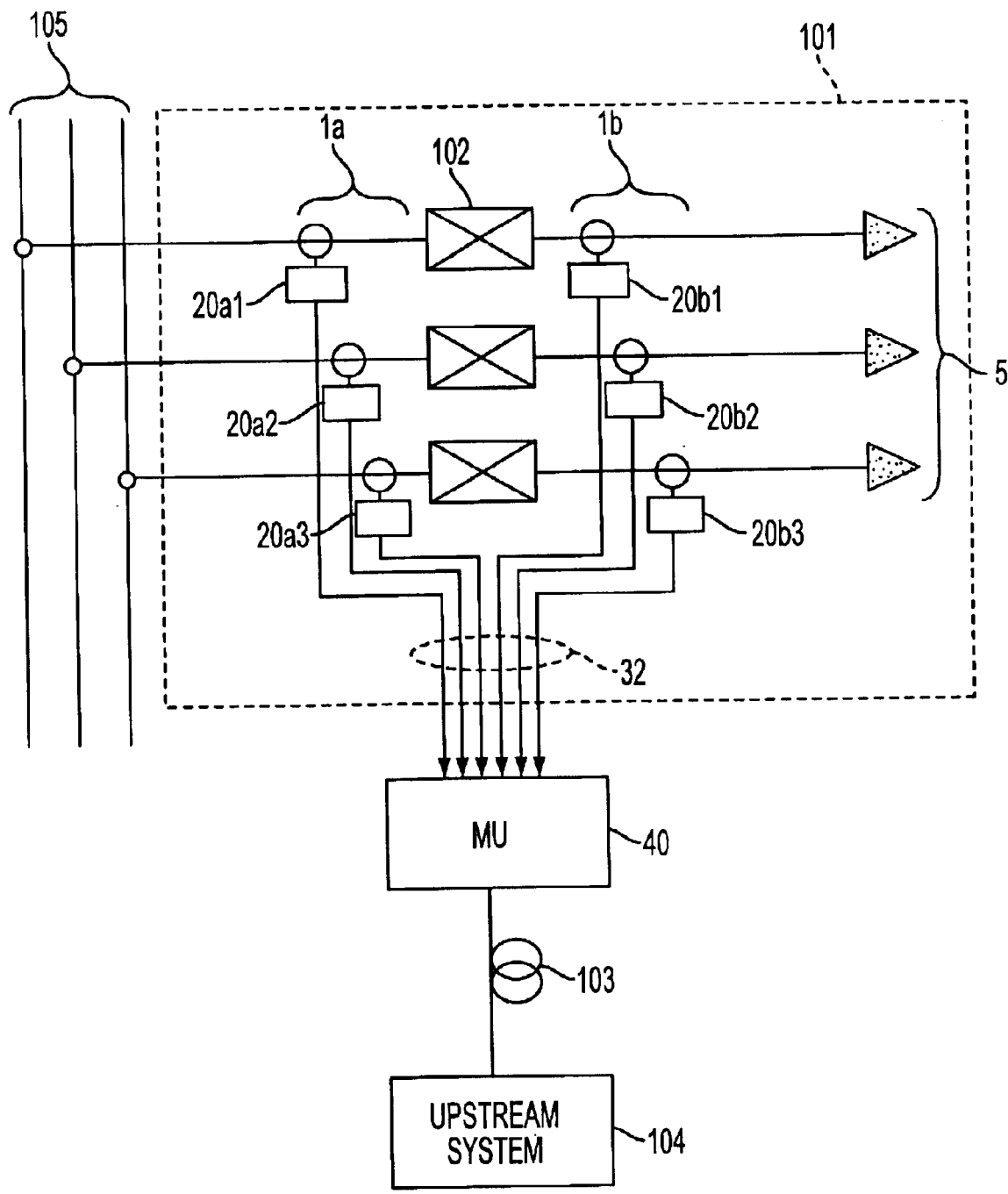
FIG. 10 is a block diagram showing an example of a system that transmits a plural measure of alternating current per one bay as one merged transmission signal in accordance with a fifth embodiment of this invention.

FIG. 10 shows an example of system configuration in case of transmitting a plurality of measures of alternating current by the unit of bay, which is the unit of zone of protection and control, as one merged transmission signal. This figure shows an example of a feeder bay 101 of single phase encapsulated type switchgear in single busbar scheme 105, shown in a three-phase line diagram. The Rogowski coils 1*a* and 1*b* is arranged on both sides of the circuit breaker 102, a conductor penetrates the Rogowsli coils 1*a*, 1*b*, and the sensor units 20*a*1, 20*a*2, 20*a*3, 20*b*1, 20*b*2, 20*b*3 are arranged at periphery of the Rogowski coils 1*a*, 1*a*, 1*a*, 1*b*, 1*b*, 1*b*, respectively. Each of the sensor units 20*a*1, 20*a*2, 20*a*3, 20*b*1, 20*b*2, 20*b*3 and the merging unit 40 are connected with an optic transmission means 32. Upstream system 104, such as a protection unit and/or a control unit, and the merging unit 40 are connected with a second optic transmission means 103. The merging unit 40 merges all of digital optical signals, i.e., digital values of measures of alternating currents, transmitted from all the sensor unit 20*a*1 through 20*b*3 in the feeder bay 101, into a merged transmission signal, and transfers the merged transmission signal to the upstream system.

Accordingly, the merging unit 40 arranged near a substation main circuit equipment can transmit information of measures of alternating current by the unit of zone of protection and control, therefore, transmission means can be operated efficiently. Since a digital optical signal is transmitted between the merging unit 40 and a protection unit and/or a control unit in an electric power installation main control building, a signal is not degraded even in a long distance transmission, thus measures of alternating current can be provided into the protection unit and/or the control unit with high quality. Moreover, since a lot of the electric cables, which has connected on-site electric power distribution main circuit equipment or substation main circuit equipment and the protection unit and/or the control unit in an electric power installation main control building, can be reduced. Furthermore, an installation time of installing substation equipments and an installation cost also can be minimized.

In addition, the following effect can be acquired as a supplementary effect in this invention. That is, an input and output circuit which has conventionally mounted on a protection unit and/or a control unit for connecting to electric power distribution main circuit equipment and/or substation main circuit equipment can be deleted, and all input and output of the protection unit and/or the control unit are performed through transmission means and there is no circuit treating high voltage and large current, thus hardware structure of the protection unit and/or the control unit is mainly constituted only by a digital calculation processing portion for processing protection function and/or control function and a communication portion for performing communication processing, therefore, many hardware components can be reduced.

Furthermore, since the current transformer of this embodiment also has a calculation function by CPU 25, a part of operation, which has been conventionally performed with the protection unit and/or the control unit, can be executed by another CPU in a current transformer side, and the operation burden of the protection unit and/or the control unit can be reduced. Moreover, by partly burdening the calculation which has been conventionally performed in the protection unit and/or the control unit, there occurs a vacant time in CPU of the protection unit and/or the control unit, and thus the protection unit and/or the control unit can perform further advanced protection and/or control calculation function or monitoring function by utilizing the vacant time. Therefore, the protection unit and/or the control unit can additionally perform advanced protection and/or control calculation and/or monitoring function, and thus performance of a substation protection and control system as a whole can be improved.

In addition, the merging of digital values of measures of alternating currents into an merged transmission signal is not limited to merging to one merged transmission signal. Hereafter, one example of merging into two merged transmission signals is explained. That is, in FIG. 10, the measure of alternating current of the Rogowski coil 1*a* attached in a busbar 105 side of the circuit breaker 102 is used for line protection relay (not illustrated). On the other hand, the measure of alternating current of the Rogowski coil 1*b* attached in an electric feeder cable (not illustrated) side of the circuit breaker 102 is used for protection operation of a bus protective relay (not illustrated).

In order to arrange that a discrimination of a kind of a measure of sending current is not necessary for a protection relay side, as for the line protection relay, measures of alternating currents transmitted from the sensor units 20*a*1, 20*a*2, 20*a*3 are merged into a first merged transmission signal to be transmitted to the line protective relay. On the other hand, for the bus protection relay, measures of alternating current transmitted from the sensor units 20*b*1, 20*b*2, 20*b*3 are merged into a second merged transmission signal to be transmitted to the bus protection relay. This method for generating the merged transmission signals is especially effective in a case where the merging unit and each unit of the upstream system 104, such as a line protection relay, a bus protection relay or BCU, are connected through a point-to-point transmission channel.

Next, several modifications of embodiments of this invention are explained.

As for the first embodiment, among various calculation functions which CPU 25 of the sensor unit 20 performs, at least a part of calculation functions not concerned with data transmission between the sensor unit 20 and the merging unit 40 (such as sensitivity compensation or phase compensation) may be performed in CPU 44 of the merging unit 40 instead of the CPU 25 of the sensor unit 20. It is clear that the same effect as that of the fifth embodiment can be also acquired in this modification. In this case, the necessary function of the sensor unit 20 is mainly just converting an analog-voltage signal outputted from the Rogowski coil 1 into a digital optical signal and transmitting data to the merging unit 40 through the optic transmission means 32. Accordingly, the CPU 25 of the sensor unit can be eliminated and the composition of the sensor unit 20 becomes very simple hardware composition. Here, the elimination of the CPU 25 means that control LSI (large-scale integration) corresponding to CPU with high accuracy is unnecessary.

However, it is still necessary to mount minimal control means required for realizing control for analog-to-digital conversion and optical transmission. To satisfy this need, for example, control by the PLD 24, or a combination of versatile logic IC (integrated circuits) makes possible to realize such a control.

Moreover, in the above-mentioned fifth embodiment, sampling timing of the analog-to-digital conversion of the analog-voltage signal performed in the sensor units 20 is made asynchronous among the sensor units 20, and the CPU 44 of the merging unit 40 performs synchronous compensation calculating operation based on the sampling synchronization signal transmitted from the upstream system. On the other hand, it is also possible to transmit the sampling synchronization signal from the merging unit 40 into the sensor unit 20, and to perform sampling of the analog-to-digital conversion based on this sampling synchronization signal in the sensor unit 20. That is, the sampling timing in the sensor unit 20 can be synchronized with a time synchronous standard signal which is common in an electric power installation.

In this case, the sampling synchronization signal is transferred from the merging unit 40 into the sensor unit 20 by optic transmission means. Although not illustrated, the optic transmission means for transmitting the sampling synchronization signal are added as hardware components to both the sensor unit 20 and the merging unit 40, respectively. Clearly in this case, the sensor unit 20 may or may not have CPU 25, whichever is applicable for the construction. However, in both cases, it is effective to add the time stamps by the CPU 44 of the merging unit 40.

In this modified example, it is clear that the same effect as that of the fifth embodiment can be acquired, and in addition, there is also the following effect. That is, in this modified example, the sampling timings of the analog-voltage signals among a plurality of the sensor units 20 are synchronized based on the time synchronization standard signal common to an electric power installation. Thus the CPU 44 of the merging unit 40 does not need to carry out sampling synchronous compensation operation. Thereby the load of the CPU 44 and the burden of developing software are reduced. In addition, in this modified example, the time synchronization standard signal common to an electric power installation is transmitted to the sensor unit 20 through the merging unit 40. However, arranging a hardware component so that the time synchronization standard signal common to a substation is directly transmitted into the sensor unit 20, can acquire the same effect as mentioned above, too.

Furthermore, this invention is not limited to the above-mentioned detailed embodiments, but includes one supplemental embodiment of a current transformer that the merging unit 40 is connected to each unit of the upstream system, such as a line protection relay, bus protection relay or BCU, through each of point-to-point transmission channel. According to such an embodiment, transmission information between the current transformer and the upstream system can be simplified, thus the whole system can be simplified. Here, it may be effective, in many cases, to generate a plurality of the merged transmission signal by the merging unit 40, according to transmission destinations such as a line protection relay or a bus protection relay.

Moreover, this invention also includes one supplemental embodiment of a current transformer such that the current that the merging unit 40 is connected to each unit of the upstream system, such as a line protection relay, bus protection relay or BCU with LAN (local area network). According to such an embodiment, transmission information between the current transformer and the upstream system is transmitted on one LAN, thereby, information can be commonly shared in various locations, and structure of a connection portion can be also standardized.

Moreover, to improve the reliability of whole system of the current transformer, the Rogowski coil 1, the sensor unit 20, and the integrated merging unit 40 may be duplicated, respectively. As for redundant composition, all of the components may be completely duplicated, or partly duplicated, and the redundancy can be formulated according to balance between cost and reliability required by the system to which the current transformer is applied, and here, it should not limit to one certain redundant composition.

Moreover, this invention concerns a computerized current transformer; however, a computerized instrument voltage transformer might be combined as a part of an embodiment of this invention. That is, when an adopted instrument voltage transformer is electrical instrument voltage transformer, and has a digital output, or the electrical instrument voltage transformer with an analog signal or a conventional instrument voltage transformer is adopted and additionally a conversion unit for analog-to-digital converting of an analog output of the electrical instrument voltage transformer with an analog output or the conventional voltage transformer, the merging unit 40 as mentioned in the fifth embodiment can be arranged to operate also with the digital signal from the instrument voltage transformer. The merging unit can transmit the measures of alternating current and voltage of a main circuit detected by the electrical current transformer and the electrical instrument voltage transformer together, that is, both current information and voltage information by one unit of zone of protection and control, into the upstream system. In this case, the transmission means can be effectively managed, and further, a large measure of electric cables connecting between one of on-site distribution main circuit equipment or substation main circuit equipment and one protection unit and/or one control unit of a main control building of an electric power installation. Furthermore, a time for installing substation equipment and installation cost can be reduced.

According to this invention, by combining a Rogowski coil with a printed circuit board to which general manufacture techniques of the printed circuit board are applied, and a sensor unit, arranged near the Rogowski coil, converting secondary output voltage of the Rogowski coil into a digital optical signal, a current transformer has excellent noise-proof characteristics and has higher accuracy in current measurement. That is, an influence of an external magnetic field to current measurement can be prevented because electromotive forces of the external magnetic field penetrating a center portion of an opening of the Rogowski coil are cancelled.

What is claimed is:

1. A current transformer, comprising:
   a Rogowski coil which detects an alternating current of a main circuit of power distribution equipment or substation main circuits equipment, and outputs a measure of the alternating current as an analog-voltage signal, the Rogowski coil comprising,
      a printed circuit board of multilayer type comprising four conducting layers of interconnections, having an opening at a center portion which a conductor penetrates,
      a plurality of metal foils, each extended in the shape of radiating from a center that is approximately the center of the opening, mounted on both sides of surface of the printed circuit board and on two inner conducting layers of the printed circuit board, a first winding formed by electrically connecting metal foils on a first outer side of surface of the printed circuit board and metal foils on a first inner conducting layer of the printed circuit board adjacent to the first outer side of the surfaces of the printed circuit board with first plated through holes penetrating the printed circuit board in a thickness direction, a second winding formed by electrically connecting metal foils on a second outer side of surface of the printed circuit board and metal foils on a second inner conducting layer of the printed circuit board adjacent to the second outer side of the surface of the printed circuit board with second plated through holes penetrating the printed circuit board in a thickness direction; and the first winding and the second winding connected as mirror images of each other, and connected in series, a sensor unit, comprising, an analog-to-digital converter which converts the analog-voltage signal into a digital electric signal, and an electric-to-optic converter which converts the digital electric signal into a digital optical signal; and an optic transmission path which transmits the digital optical signal to upstream system.

2. The current transformer as recited in claim 1, wherein: the Rogowski coil comprises a plurality of the printed circuit boards, arranged so that corresponding center axis openings of respective printed circuit boards are aligned with each other, and the windings formed on the respective printed circuit boards are connected to each other in series.

3. The current transformer as recited in claim 1, further comprising:

a twisted-pair wire which connects the Rogowski coil and the sensor unit.

4. The current transformer as recited in claim 1, wherein: the printed circuit board is formed in the shape of a regular octagon.

5. The current transformer as recited in claim 1, wherein a number of the Rogoski coils, a number of the sensor units, and a number of the optic transmission paths are more than one, respectively, and the current transformer further comprises:

an merging unit which merges a plurality of the digital optical signals each outputted from the respective Rogowski coils through the respective sensor units to generate at least one merged transmission signal, and transmits the merged transmission signal to the upstream system.

6. The current transformer as recited in claim 5, wherein the merging unit comprises:

a plurality of optic-to-electric converters, each of which converts the respective digital optical signals into a second digital electric signal;

an merging means which merges the respective second digital electric signals to generate at least one electric merged transmission signal; and a second electric-to-optic converter which converts the electric merged transmission signal into a second digital optical signal.

7. The current transformer as recited in claim 5, wherein the merging unit and the upstream system are connected through a point-to-point transmission channel.

8. The current transformer as recited in claim 5, wherein the merging unit and the upstream system are connected through a local area network.

9. A current transformer, comprising:

a Rogowski coil which detects an alternating current of a main circuit of power distribution equipment or substation main circuits equipment, and outputs a measure of the alternating current as an analog-voltage signal, the Rogowski coil comprising, a printed circuit board, having an opening at a center portion which a conductor penetrates, including a plurality of stacked layers each having an opening at a center portion which a conductor penetrates, having at least three sheets of first layers formed of core material, and at least two sheets of second layers formed of prepreg material each arranged between respective two of the first layers, a plurality of first metal foils and a plurality of second metal foils, each extended in the shape of radiating from a center that is approximately the center of the opening, mounted on an outer side and an inner side of a first outer layer formed of the core material, respectively, a first winding formed by electrically connecting the first metal foils and the second metal foils with first plated through holes penetrating the first outer layer in a thickness direction, a plurality of third metal foils and a plurality of fourth metal foils, each extended in the shape of radiating from a center that is approximately the center of the opening, mounted on an inner side and an outer side of a second outer layer formed of the core material, respectively, a second winding formed by electrically connecting the third metal foils and the fourth metal foils with second plated through holes penetrating the second outer layer in a thickness direction, the second winding formed as a mirror image of the first winding, one of the second metal foils and one of the third metal foils being electrically connected with a third plated through hole penetrating the plurality of stacked layers of the printed circuit board in a thickness direction, the first metal foils and the fourth metal foils being electrically disconnected with the third plated through hole, and thereby, the first winding and the second winding being electrically connected in series;

a sensor unit, comprising, an analog-to-digital converter which converts the analog-voltage signal into a digital electric signal, and an electric-to-optic converter which converts the digital electric signal into a digital optical signal; and an optic transmission path which transmits the digital optical signal to upstream system.

10. The current transformer as recited in claim 9, further comprising:

a first terminal area in which the analog-voltage signal is extracted, mounted on the outer side of the first outer layer formed of core material, the first terminal area surrounding the third plated through hole and being electrically disconnected with the third plated through hole;

a second terminal area in which the analog-voltage signal is extracted, mounted on the outer side of the second outer layer formed of core material, the second terminal surrounding the third plated through hole and being electrically disconnected with the third plated through hole;

the first terminal and the second terminal arranged symmetrically to each other.

11. The current transformer as recited in claim 9, wherein:

the Rogowski coil comprises a plurality of the printed circuit boards, arranged so that corresponding center axis openings of respective printed circuit boards are aligned with each other, and the windings formed on the respective printed circuit boards are connected to each other in series.

12. The current transformer as recited in claim 9, further comprising:

a twisted-pair wire which connects the Rogowski coil and the sensor unit.

13. The current transformer as recited in claim 9, wherein:

the printed circuit board is formed in the shape of a regular octagon.

14. The current transformer as recited in claim 9, wherein a number of the Rogoski coils, a number of the sensor units, and a number of the optic transmission paths are more than one, respectively, and the current transformer further comprises:

an merging unit which merges a plurality of the digital optical signals each outputted from the respective Rogowski coils through the respective sensor units to generate at least one merged transmission signal, and transmits the merged transmission signal to the upstream system.

15. The current transformer as recited in claim 14, wherein the merging unit comprises:

a plurality of optic-to-electric converters, each of which converts the respective digital optical signals into a second digital electric signal;

an merging means which merges the respective second digital electric signals to generate at least one electric merged transmission signal; and a second electric-to-optic converter which converts the electric merged transmission signal into a second digital optical signal.

16. A current transformer, comprising:

a Rogowski coil which detects an alternating current of a main circuit of power distribution equipment or substation main circuits equipment, and outputs a measure of the alternating current as an analog-voltage signal, the Rogowski coil comprising, a printed board of multilayer type comprising three conducting layers of interconnections, having an opening at a center portion which a conductor penetrates, a plurality of first metal foils each extended in the shape of radiating from a center that is approximately the center of the opening, mounted on a first outer side of surface of the printed circuit board, a plurality of second metal foils each extended in the shape of radiating from a center that is approximately the center of the opening, mounted on a second outer side of surface of the printed circuit board, a winding formed by electrically connecting the first metal foils and the second metal foils with plated through holes penetrating the printed circuit boards in a thickness direction;

a return circuit line formed by a circular metal foil with a center that is approximately the center of the opening, mounted on an inner conductive layer of the printed circuit boards, and the winding and the return circuit line being connected in series;

a sensor unit, comprising, an analog-to-digital converter which converts the analog-voltage signal into a digital electric signal, and an electric-to-optic converter which converts the digital electric signal into a digital optical signal; and an optic transmission path which transmits the digital optical signal to upstream system.

17. The current transformer as recited in claim 16, wherein:

the Rogowski coil comprises a plurality of the printed circuit boards, arranged so that corresponding center axis openings of respective printed circuit boards are aligned with each other, and the windings formed on the respective printed circuit boards are connected to each other in series.

18. The current transformer as recited in claim 16, further comprising:

a twisted-pair wire which connects the Rogowski coil and the sensor unit.

19. The current transformer as recited in claim 16, wherein:

the printed circuit board is formed in the shape of a regular octagon.

20. The current transformer as recited in claim 16, wherein a number of the Rogoski coils, a number of the sensor units, and a number of the optic transmission paths are more than one, respectively, and the current transformer further comprises:

an merging unit which merges a plurality of the digital optical signals each outputted from the respective Rogowski coils through the respective sensor units to generate at least one merged transmission signal, and transmits the merged transmission signal to the upstream system.

21. A Rogowski coil for a current transformer, which detects an alternating current of a main circuit of power distribution equipment or substation main circuits equipment, and outputs a measure of the alternating current as an analog-voltage signal, comprising:

a printed circuit board of multilayer type comprising four conducting layers of interconnections, having an opening at a center portion which a conductor penetrates;

a plurality of metal foils, each extended in the shape of radiating from a center that is approximately the center of the opening, mounted on both sides of surface of the printed circuit board and on two inner conducting layers of the printed circuit board;

a first winding formed by electrically connecting metal foils on a first outer side of surface of the printed circuit board and metal foils on a first inner conducting layer of the printed circuit board adjacent to the first outer side of the surfaces of the printed circuit board with first plated through holes penetrating the printed circuit board in a thickness direction;

a second winding formed by electrically connecting metal foils on a second outer side of surface of the printed circuit board and metal foils on a second inner conducting layer of the printed circuit board adjacent to the second outer side of the surface of the printed circuit board with second plated through holes penetrating the printed circuit board in a thickness direction; and the first winding and the second winding connected as mirror images of each other, and connected in series.

22. The Rogowski coil as recited in claim 21, wherein the first winding and the second winding are formed as closed loops, respectively.

23. A Rogowski coil for a current transformer, which detects an alternating current of a main circuit of power distribution equipment or substation main circuits equipment, and outputs a measure of the alternating current as an analog-voltage signal, comprising:

- a printed board of multilayer type comprising three conducting layers of interconnections, having an opening at a center portion which a conductor penetrates;
- a plurality of first metal foils each extended in the shape of radiating from a center that is approximately the center of the opening, mounted on a first outer side of surface of the printed circuit board;
- a plurality of second metal foils each extended in the shape of radiating from a center that is approximately the center of the opening, mounted on a second outer side of surface of the printed circuit board;
- a winding formed by electrically connecting the first metal foils and the second metal foils with plated through holes penetrating the printed circuit boards in a thickness direction;
- a return circuit line formed by a circular metal foil with a center that is approximately the center of the opening, mounted on an inner conductive layer of the printed circuit boards; and
- the winding and the return circuit line being connected in series.

* * * * *